(12) United States Patent
Oh et al.

(10) Patent No.: US 9,048,193 B2
(45) Date of Patent: Jun. 2, 2015

(54) METHOD OF FORMING A STEP PATTERN STRUCTURE

(71) Applicants: Jung-Ik Oh, Seongnam-Si (KR); Dae-Hyun Jang, Seongnam-Si (KR); Seong-Soo Lee, Seongnam-Si (KR); Han-Na Cho, Incheon (KR)

(72) Inventors: Jung-Ik Oh, Seongnam-Si (KR); Dae-Hyun Jang, Seongnam-Si (KR); Seong-Soo Lee, Seongnam-Si (KR); Han-Na Cho, Incheon (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 71 days.

(21) Appl. No.: 13/910,734

(22) Filed: Jun. 5, 2013

(65) Prior Publication Data

US 2014/0057429 A1    Feb. 27, 2014

(30) Foreign Application Priority Data

Aug. 27, 2012  (KR) .................. 10-2012-0093498

(51) Int. Cl.
| | |
|---|---|
| *H01L 21/44* | (2006.01) |
| *H01L 21/308* | (2006.01) |
| *H01L 21/768* | (2006.01) |
| *H01L 21/311* | (2006.01) |
| *H01L 27/115* | (2006.01) |
| *H01L 21/027* | (2006.01) |

(52) U.S. Cl.
CPC ........ *H01L 21/308* (2013.01); *H01L 21/76885* (2013.01); *H01L 21/31144* (2013.01); *H01L 27/11575* (2013.01); *H01L 27/11582* (2013.01); *H01L 21/0273* (2013.01)

(58) Field of Classification Search
None
See application file for complete search history.

(56) References Cited

U.S. PATENT DOCUMENTS

| 7,642,545 B2 | 1/2010 | Urban et al. |
|---|---|---|
| 7,989,147 B2 | 8/2011 | Kim et al. |
| 2007/0176214 A1 | 8/2007 | Kwon et al. |

(Continued)

FOREIGN PATENT DOCUMENTS

| JP | 2008-205016 | 9/2008 |
|---|---|---|
| KR | 10-2006-0042498 | 5/2006 |
| KR | 10-2011-0015338 | 2/2011 |

OTHER PUBLICATIONS

English Abstract for Publication No. 10-2006-0042498.

(Continued)

*Primary Examiner* — Robert Bachner
(74) *Attorney, Agent, or Firm* — F. Chau & Associates, LLC

(57) ABSTRACT

A method of forming a multi-floor step pattern structure includes forming a stacked structure having alternating insulating interlayers and sacrificial layers on a substrate. A first photoresist pattern is formed on the stacked structure. A first preliminary step pattern structure is formed by etching portions of the stacked structure using the first photoresist pattern as an etching mask. A passivation layer pattern is formed on upper surfaces of the first photoresist pattern and the first preliminary step pattern structure. A second photoresist pattern is formed by removing a side wall portion of the first photoresist pattern exposed by the passivation layer pattern. A second preliminary step pattern structure is formed by etching exposed insulating interlayers and underlying sacrificial layers using the second photoresist pattern as an etching mask. The above steps may be repeated on the second preliminary step pattern structure to form the multi-floor step pattern structure.

15 Claims, 20 Drawing Sheets

(56) References Cited

U.S. PATENT DOCUMENTS

| | | |
|---|---|---|
| 2008/0173936 A1 | 7/2008 | Yoon et al. |
| 2008/0293166 A1 | 11/2008 | Sun et al. |
| 2009/0294781 A1 | 12/2009 | Kim et al. |
| 2010/0090286 A1 | 4/2010 | Lee et al. |
| 2011/0031630 A1 | 2/2011 | Hashimoto |
| 2011/0177639 A1 | 7/2011 | Kang et al. |
| 2012/0052674 A1 | 3/2012 | Lee et al. |
| 2012/0171861 A1 * | 7/2012 | Park et al. ............ 438/639 |

OTHER PUBLICATIONS

English Abstract for Publication No. 2008-205016.
English Abstract for Publication No. 10-2011-0015338.

* cited by examiner

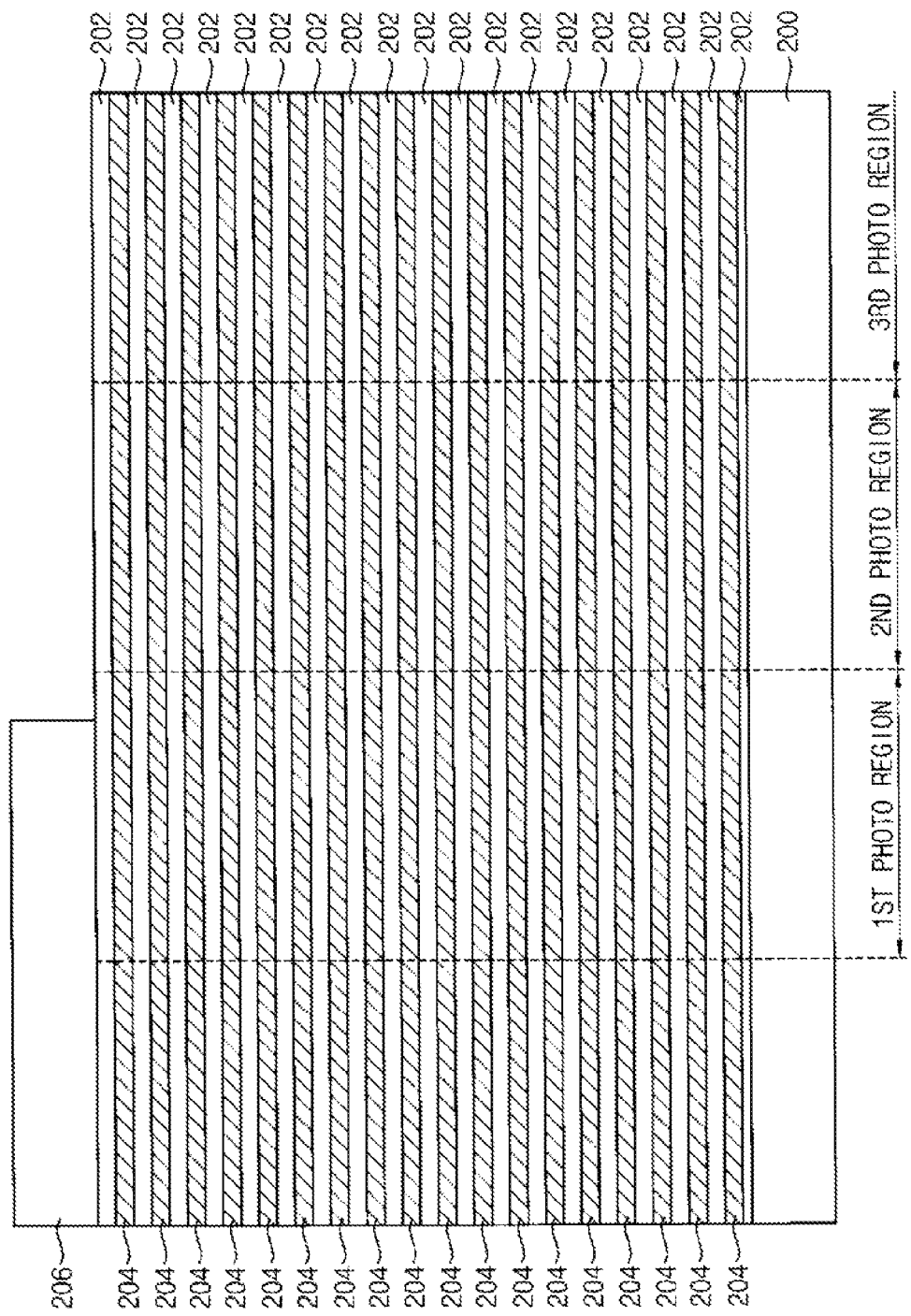

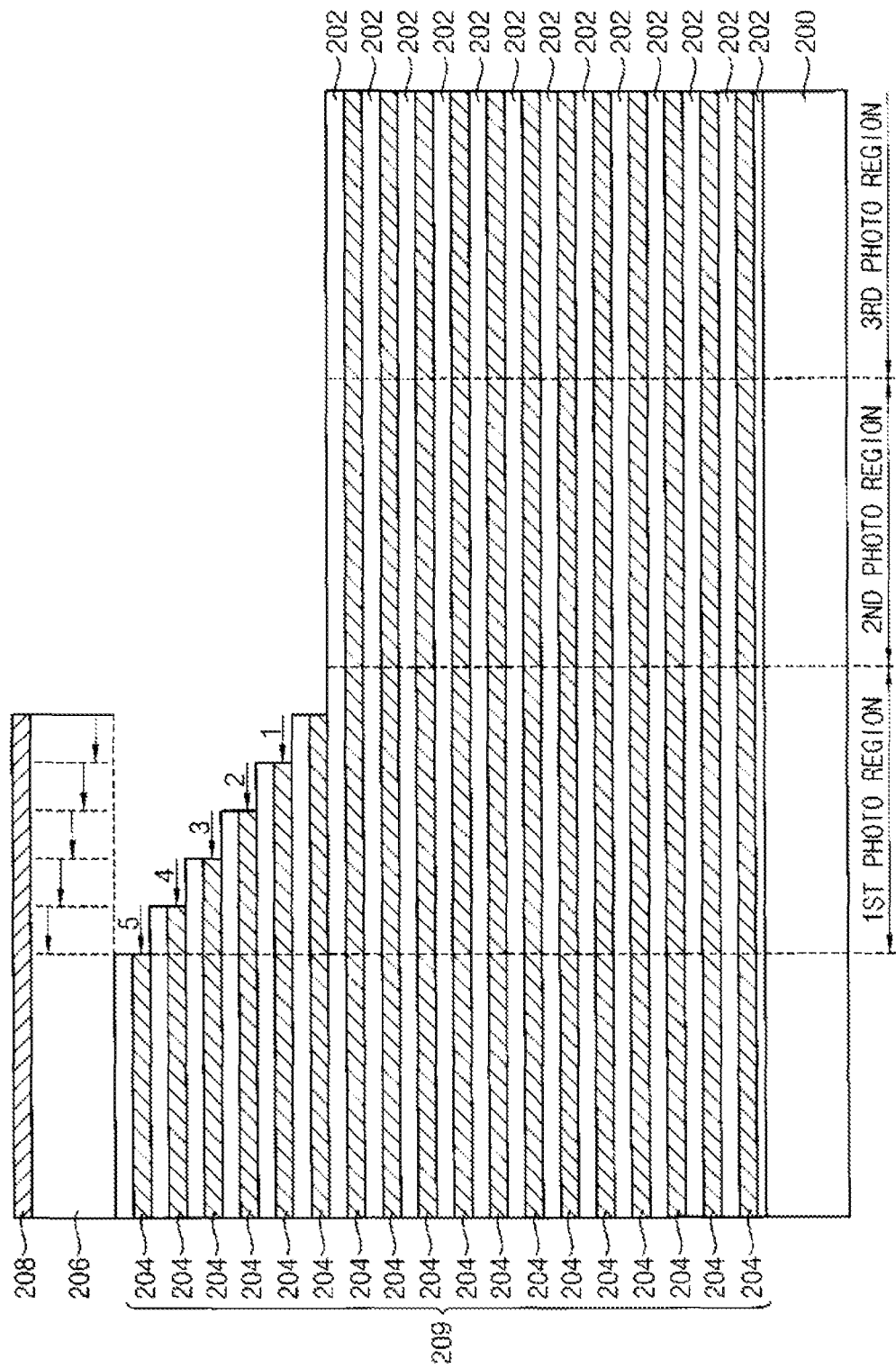

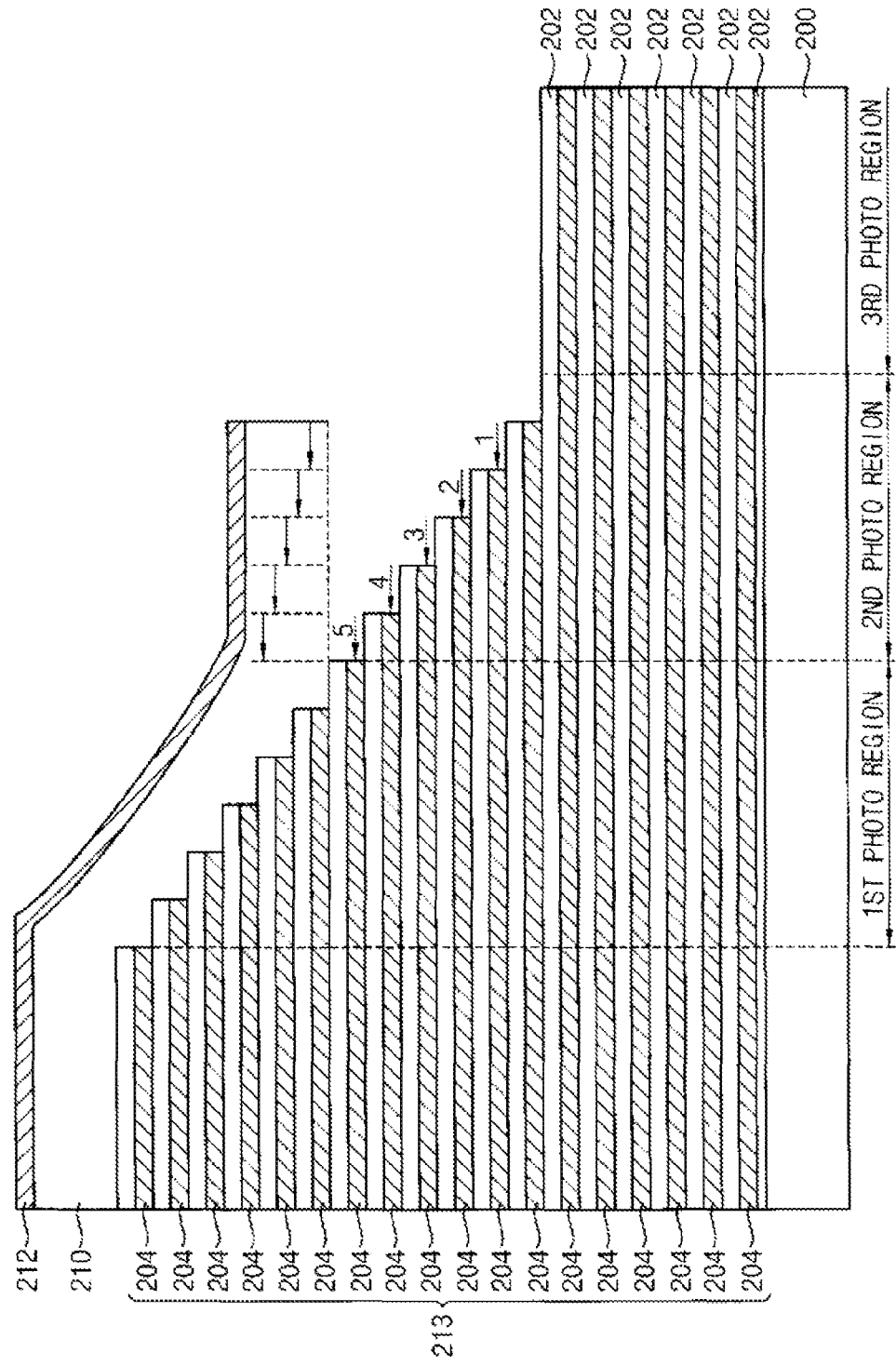

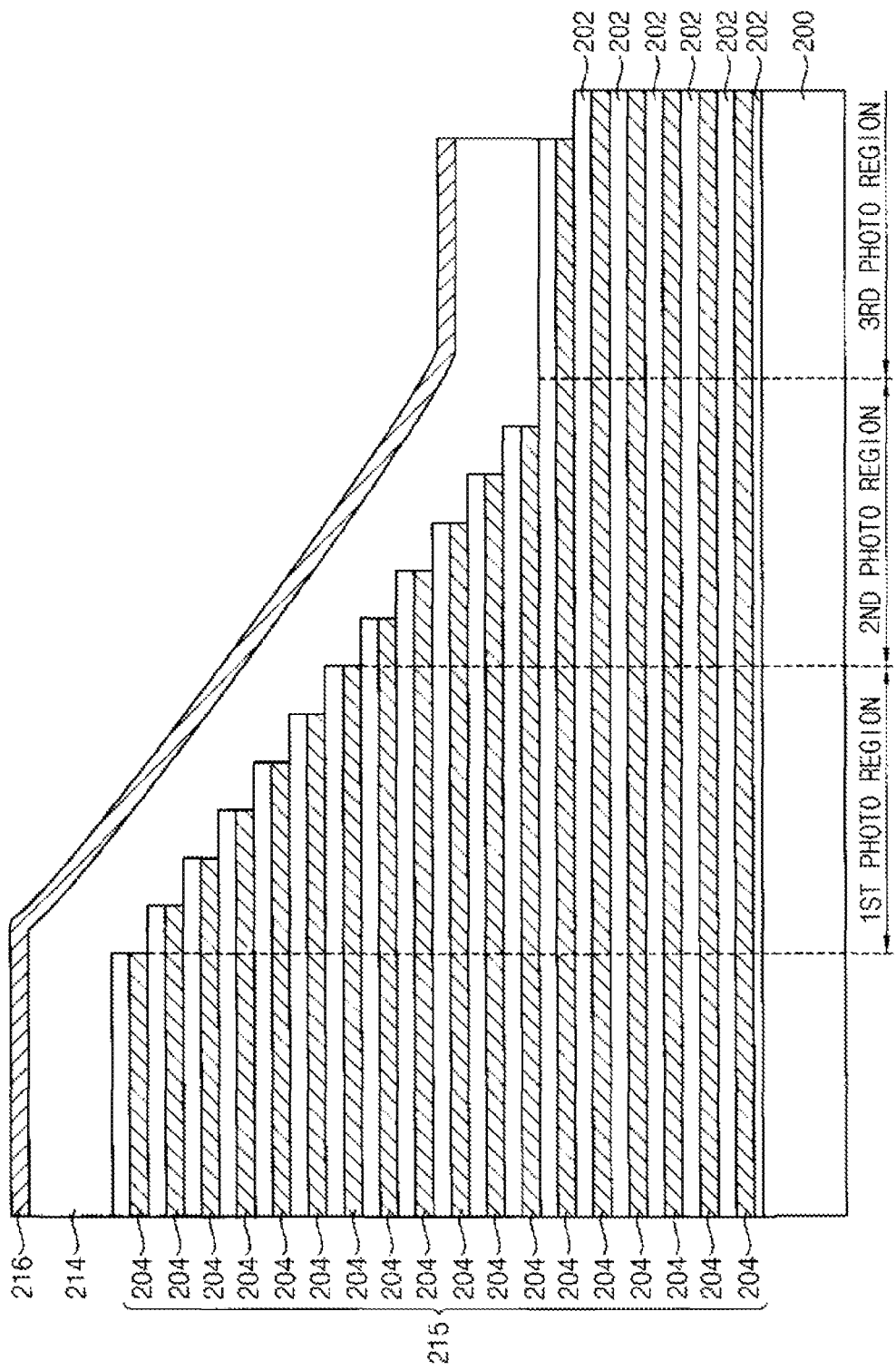

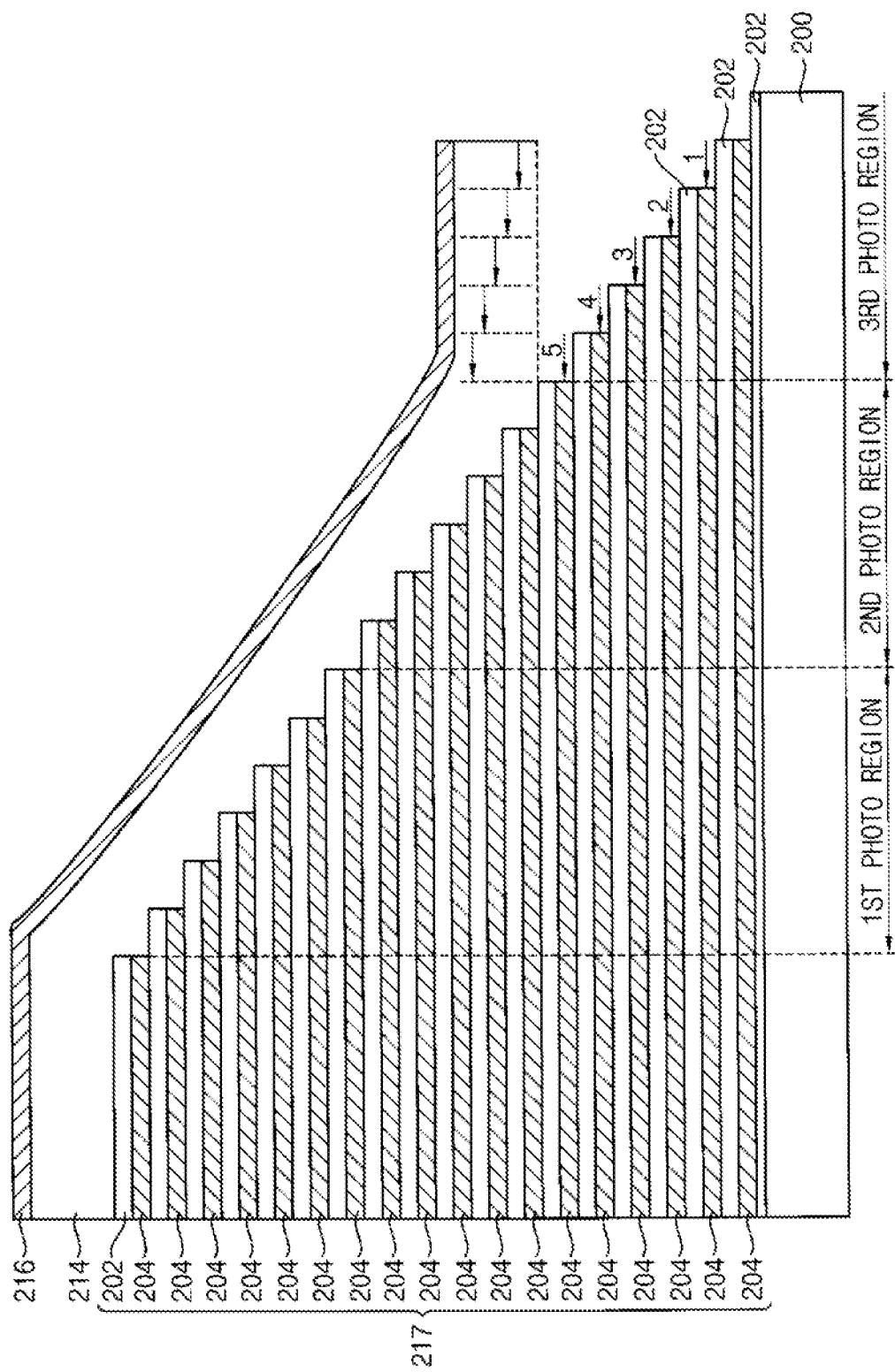

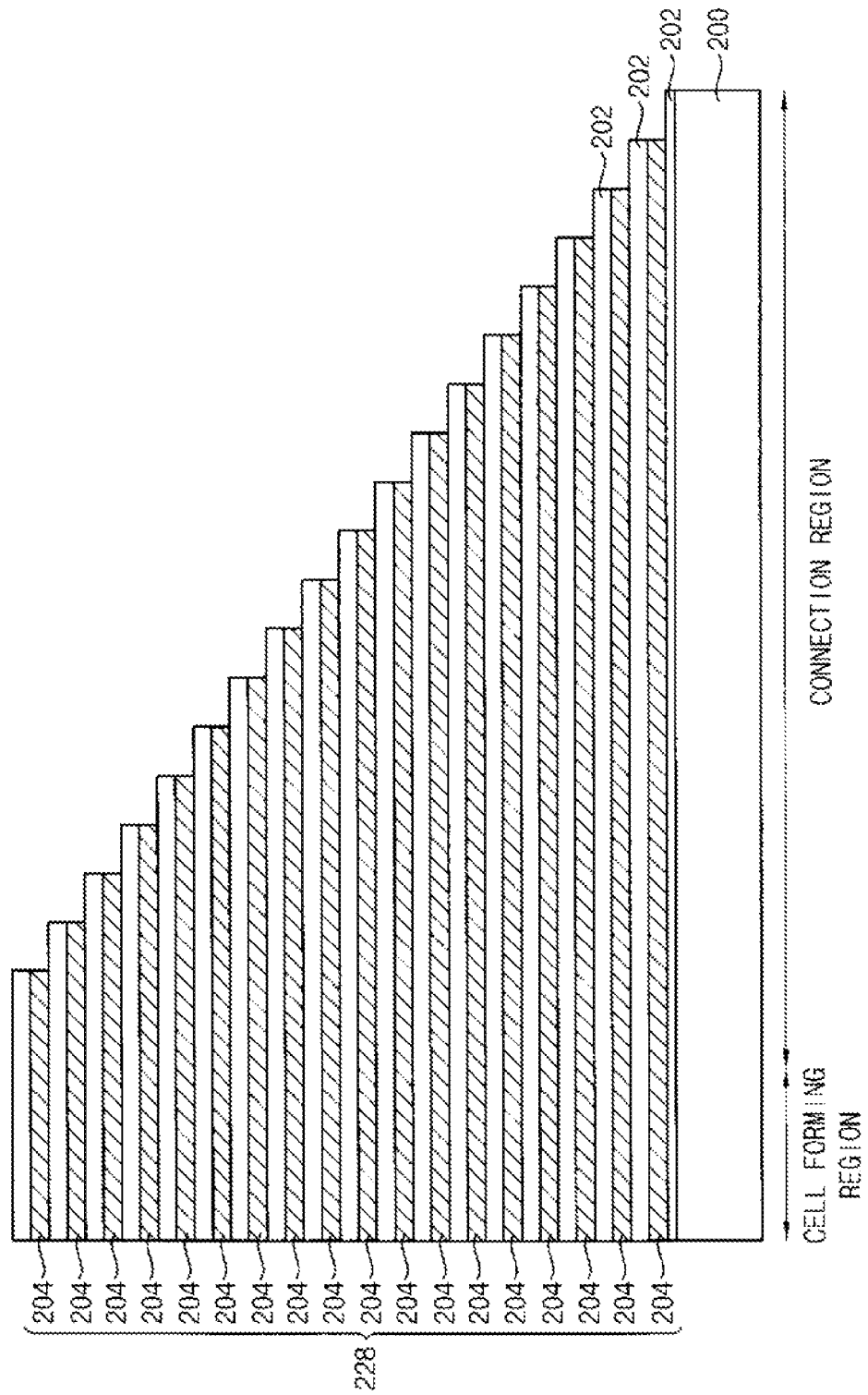

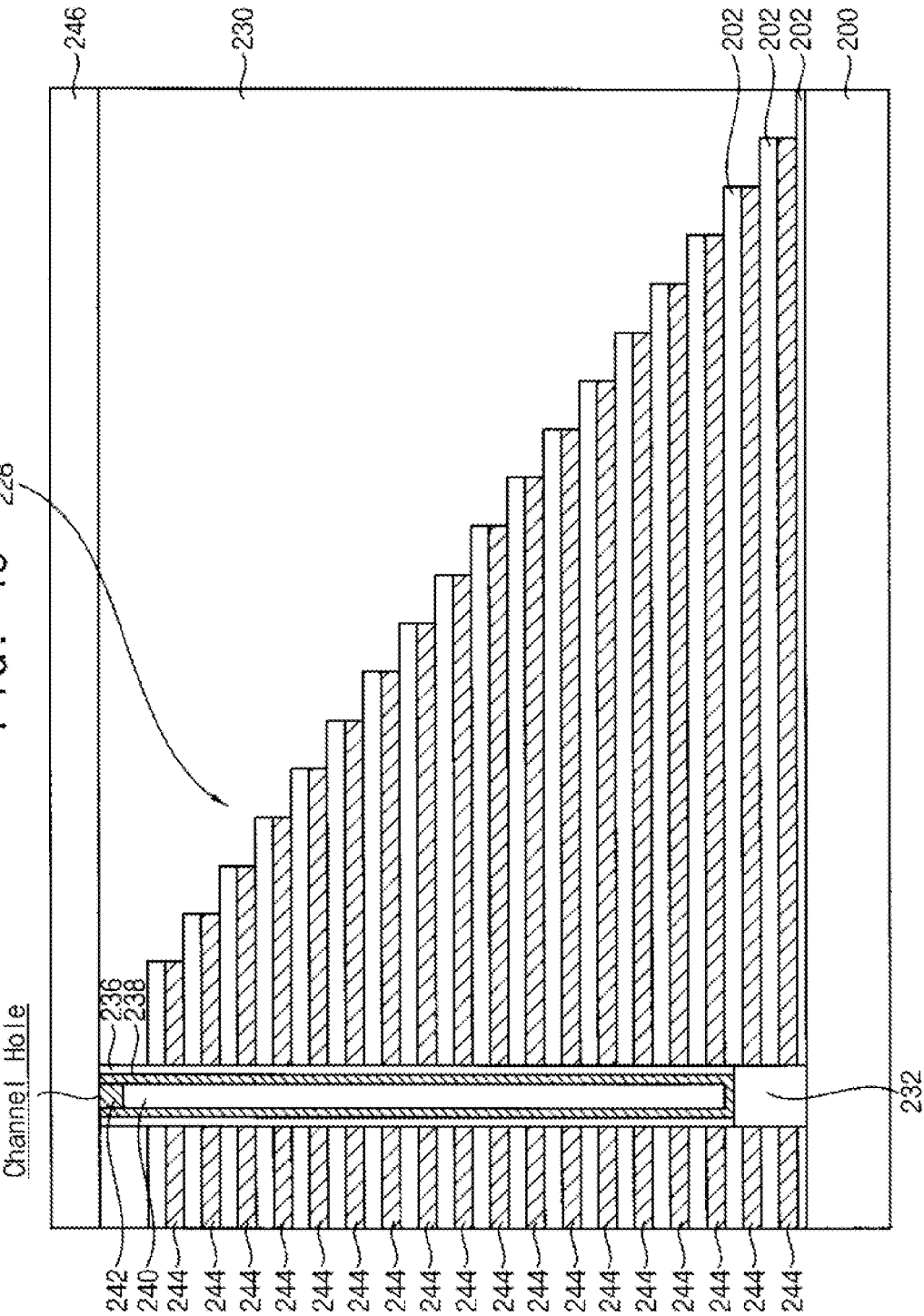

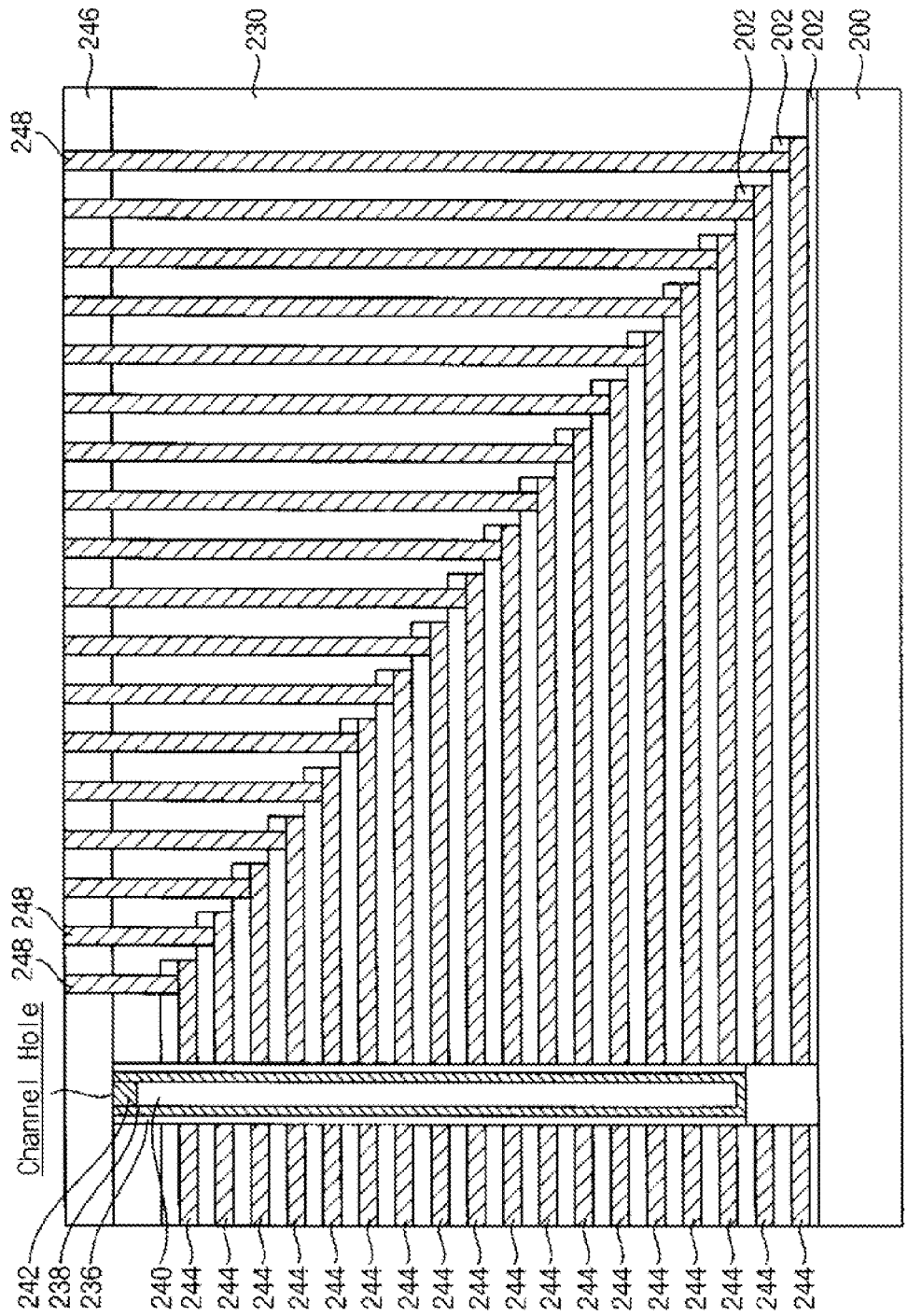

METHOD OF FORMING A STEP PATTERN STRUCTURE

CROSS-REFERENCE TO RELATED APPLICATION

This application claims priority under 35 USC §119 from Korean Patent Application No. 10-2012-0093498 filed on Aug. 27, 2012 in the Korean Intellectual Property Office (KIPO), the contents of which are herein incorporated by reference in their entirety.

BACKGROUND

1. Technical Field

Exemplary embodiments relate to a method of forming a step pattern structure. More particularly, exemplary embodiments relate to a method of forming a step pattern structure applicable in a vertical-type memory device.

2. Discussion of the Related Art

A technique of vertically stacking cells with respect to the surface of a substrate has been recently been developed to fabricate more highly integrated semiconductor devices. In a vertical-type semiconductor device, the cells and the wirings connecting the cells may have a vertically stacked structure. To independently apply an electric signal to each of the vertically stacked wirings, a step pattern structure may be formed at an edge portion of each wiring to provide a pad for a contact connection. To form a step pattern structure, a number of photolithography and etching processes may be required. The number of required photolithography processes and etching processes may be accompanied with an increased processing cost.

SUMMARY

Exemplary embodiments provide a method of forming a step pattern structure by decreasing a number of the photolithography steps.

According to exemplary embodiments, there is provided a method of forming a step pattern structure. In the method, a stacked structure is formed by alternately stacking a plurality of insulating interlayers and a plurality of sacrificial layers on a substrate. A first photoresist pattern is formed on the stacked structure. A first preliminary step pattern structure is formed by etching portions of one uppermost insulating interlayer and one uppermost sacrificial layer using the first photoresist pattern as an etching mask. A first passivation layer is formed on an upper surface and a side wall of the first photoresist pattern and on an upper surface and a side wall of the first preliminary step pattern structure. A first passivation layer pattern is formed by removing the first passivation layer formed on the side wall of the first photoresist pattern. A second photoresist pattern is formed by removing a portion of the side wall of the first photoresist pattern exposed by the first passivation layer pattern. A second preliminary step pattern structure is formed by respectively etching two exposed uppermost insulating interlayers and two underlying sacrificial layers using the second photoresist pattern as an etching mask. A multi-floor step pattern structure is formed by repeatedly performing processes from the step of forming the first passivation layer to step of forming the second preliminary step pattern structure.

In exemplary embodiments, a first portion of the first passivation layer formed on the upper surface of the first photoresist pattern and on the upper surface of the first preliminary step pattern structure may be formed to have a thickness greater than that of a second portion of the first passivation layer formed on the side wall of the first photoresist pattern and on the side wall of the first preliminary step pattern structure.

In exemplary embodiments, the first passivation layer includes an inorganic material that may be a same material as the uppermost layer of the stacked structure. The first passivation layer may comprise silicon oxide. The first passivation layer may be formed by using $SiCl_4$ and an $O_2$ gas as reaction gases.

In exemplary embodiments, the first passivation layer may be formed by injecting a source gas in a chamber for performing the etching process that forms the first preliminary step pattern structure.

In exemplary embodiments, the processes from the step of forming the first preliminary step pattern structure to the step of forming the second preliminary step pattern structure may be performed in situ in one etching chamber.

In exemplary embodiments, a remaining portion of the first passivation layer pattern on the second photoresist pattern and the first preliminary step pattern structure may be removed together while forming the second preliminary step pattern structure.

In exemplary embodiments, the processes from the step of forming the second photoresist pattern to step of forming the second preliminary step pattern structure are repeated four or more times.

In exemplary embodiments, the insulating interlayer may be formed from silicon oxide, and the sacrificial layer may be formed from a material having an etch selectivity with respect to the insulating interlayer. The sacrificial layers may comprise silicon nitride or polysilicon.

In exemplary embodiments, after forming the second photoresist pattern, a portion of the first passivation layer pattern protruding from a side of the second photoresist pattern is removed.

According to exemplary embodiments, there is provided a method of forming a multi-floor step pattern structure. In the method, a stacked structure is formed by alternately stacking a plurality of insulating interlayers and a plurality of sacrificial layers on a substrate. A photoresist pattern is formed on at least a portion of the stacked structure. A first preliminary step pattern structure is formed by etching portions of one uppermost insulating interlayer and one uppermost sacrificial layer using the photoresist pattern as an etching mask. A passivation layer pattern is formed on an upper surface of the photoresist pattern and on an upper surface of the first preliminary step pattern structure. A trimmed photoresist pattern is formed by removing a portion of the side wall of the photoresist pattern exposed by the passivation layer pattern. A second preliminary step pattern structure is formed by respectively etching portions of two exposed uppermost insulating interlayers and two underlying sacrificial layers using the trimmed photoresist pattern as an etching mask. A plurality of steps are formed in the stacked structure is formed by repeatedly performing processes from the step of forming the passivation pattern to the step of forming the second preliminary step pattern structure. A multi-floor step pattern structure is formed by repeatedly performing processes from the step of forming photoresist pattern to the step of forming a plurality of steps in the stacked structure.

In exemplary embodiments, processes from the step of forming the first preliminary step pattern structure to the step of forming the plurality of steps in the stacked structure are performed in situ in one etching chamber.

In exemplary embodiments, the processes from the step of forming the photoresist pattern to the step of forming the plurality of steps in the stacked structure are repeated at least twice.

In exemplary embodiments, after forming the step pattern structure, the sacrificial layers of each floor is removed by an etching process. Then, a metal material layer is formed in spaces formed by removing the sacrificial layers.

According to exemplary embodiments, there is provided a method of manufacturing a vertical-type semiconductor device having a word line structure. In the method, a semiconductor substrate is provided that includes a cell forming region for forming the memory cells and a connection region for forming wirings for electrically connecting the memory cells. A stacked structure is formed by alternately stacking a plurality of first insulating interlayers and a plurality of sacrificial layers on the semiconductor substrate. A multi-floor step pattern structure is formed in the connection region from the stacked structure. A second insulating interlayer is formed that covers the multi-floor step pattern structure. A plurality of channel holes are formed that penetrate the multi-floor step pattern structure to expose the surface of the substrate.

In exemplary embodiments, pillar structures are formed that include a semiconductor pattern and a channel pattern in the channel holes. An opening portion is formed that has a trench shape that extends in one direction by etching the step shape mold pattern between the pillar structures. The surface of the substrate is exposed through the bottom of the opening portion. The sacrificial layer patterns 204 exposed through the side wall of the opening portion is removed to form gaps between the stacked first insulating interlayers. Word line structures are formed in the space formed by removing the sacrificial layer patterns, and N-type impurities are doped into the substrate through a bottom of the opening portion to form an impurity region.

In exemplary embodiments, a third insulating interlayer is formed that covers the structures. A bit line contact and a bit line that electrically connects with the bit line contact in the third insulating interlayer are formed. Contact plugs are formed that contact with a side edge portion of the word line structure through the third and second insulating interlayer, and the first insulating interlayer at each floor.

In exemplary embodiments, forming pillar structures may include forming a semiconductor pattern filling an inner and lower portion of the channel holes, and forming a charge storing layer and a tunnel insulating layer on an inner side wall of the channel holes. On the tunnel insulating layer, the channel pattern is formed that contacts the semiconductor pattern. On the channel pattern, a burying insulating layer pattern is formed that buries most of the inner portion of the channel holes is formed. On the burying insulating layer pattern, a pad pattern is formed that contacts a side wall of the channel pattern and covers an inlet portion of the channel hole.

In exemplary embodiments, the sacrificial layer may be made of polysilicon. Then a blocking dielectric layer, a charge storing layer, and a tunnel insulating layer are formed on an inner side wall of the channel holes. On the tunnel insulating layer, a channel pattern is formed that contacts the surface of the substrate that completely fills the inner portion of the channel hole. A third insulating interlayer is formed on the second insulating interlayer. A bit line contact is formed that contacts the channel pattern and a bit line is formed that electrically connects with the bit line contact in the third insulating interlayer. Contact plugs are formed that contact side edge portions of the word line structure through the third and second insulating interlayers and the first insulating interlayer at each floor.

As described above, the upper surface of a previously formed photoresist pattern may be hardly removed while performing a trimming process of the photoresist pattern in accordance with exemplary embodiments. Since the thickness decrease and the width distribution of the photoresist pattern are hardly generated during the trimming process, the number of the photo trimming processes may be increased. Accordingly, the number of the photolithography steps for forming the step pattern structure may be decreased. Therefore, a vertical-type semiconductor device may be manufactured at a low cost.

BRIEF DESCRIPTION OF THE DRAWINGS

FIGS. 2A to 2G are cross-sectional views illustrating a method of forming a step pattern structure in accordance with exemplary embodiments;

FIGS. 4A to 4D are cross-sectional views illustrating a method of forming a vertical-type semiconductor device in accordance with Example 2 of the present inventive concept.

DETAILED DESCRIPTION OF EXEMPLARY EMBODIMENTS

Figure 1A:
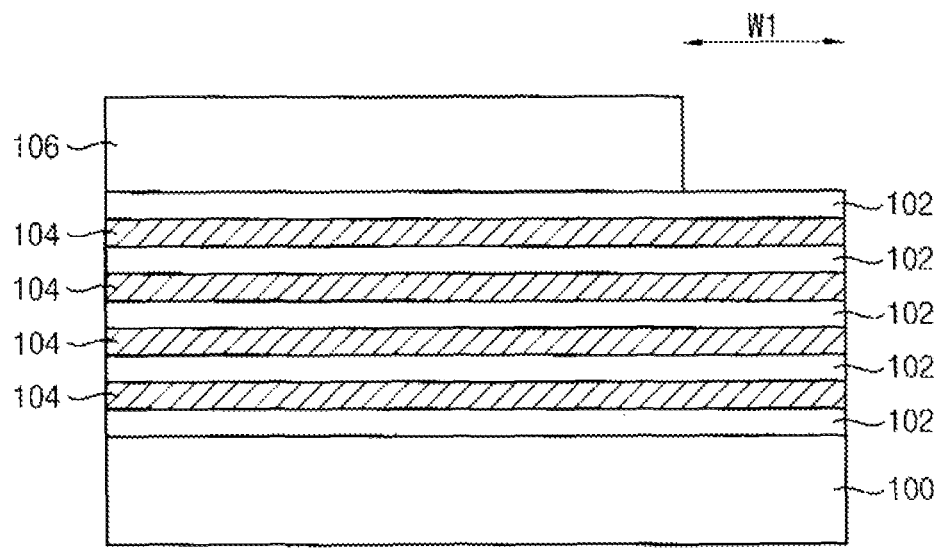
FIGS. 1A to 1L are cross-sectional views illustrating a method of forming a step pattern structure in accordance with Example 1 of the present inventive concept.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, exemplary embodiments will be explained in detail with reference to the accompanying drawings.

EXAMPLE 1

FIGS. 1A to 1L are cross-sectional views illustrating a method of forming a step pattern structure in accordance with Example 1 of the present inventive concept.

Referring to FIG. 1A, insulating interlayers 102 and sacrificial layers 104 are subsequently and alternately stacked on a substrate 100 to form a stacked structure. At the uppermost layer of the stacked structure, the insulating interlayer 102 may be formed.

The insulating interlayer 102 may be formed by depositing silicon oxide. The sacrificial layer 104 may be formed by using a material having an etch selectivity with respect to the insulating interlayer 102. In particular, the sacrificial layer 104 may be formed by using silicon nitride or polysilicon. Hereinafter, for simplicity of exposition, a sacrificial layer 104 formed by using silicon nitride will be described. However, it is to be understood that this description is exemplary and non-limiting, and that sacrificial layer 104 formed from polysilicon are within the scope of other embodiments.

The number of stacked insulating interlayers 102 and sacrificial layers 104 is not limited. In this exemplary embodiment, five insulating interlayers and four sacrificial layers may be alternately stacked from the surface of the substrate 100.

On the uppermost insulating interlayer 102, a photoresist layer may be formed. The photoresist layer may be formed by a spin coating process. The photoresist pattern may be patterned to a predetermined thickness range by a photolithography process. In particular, the photoresist layer may be formed to a thickness of about 1 μm to about 6 μm. A first photoresist pattern 106 may be formed by patterning the photoresist pattern through a photolithography process.

The first photoresist pattern 106 may be formed to expose an edge portion of the uppermost insulating interlayer 102. The width W1 of the exposed portion by the first photoresist pattern 106 may be substantially the same as the upper width of each floor of a step pattern structure to be formed.

Figure 1B:
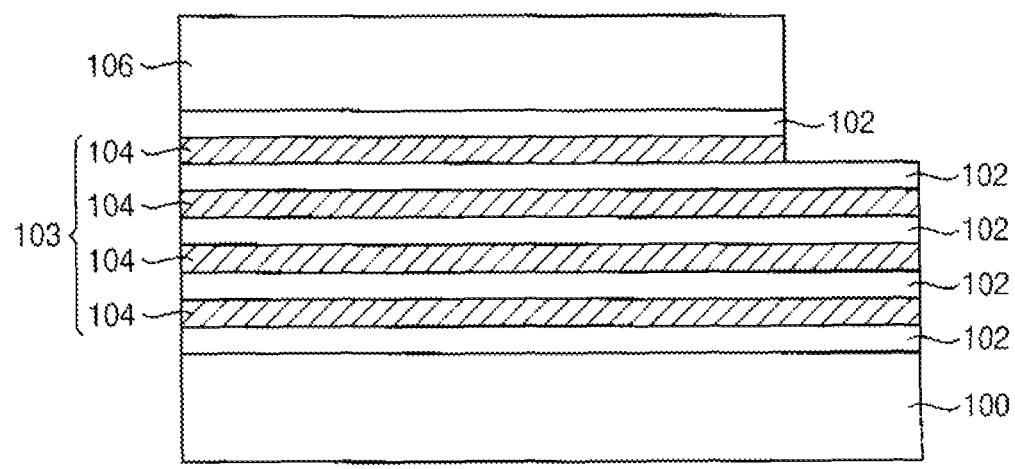

Referring to FIG. 1B, one uppermost insulating interlayer 102 exposed by the first photoresist pattern 106 and one uppermost sacrificial layer 104 may be etched using the first photoresist pattern 106 as an etching mask.

The etching process may remove a portion of the fifth insulating interlayer and the fourth sacrificial layer to form a first preliminary step pattern structure 103. The first preliminary step pattern 103 has one floor at the uppermost portion. Hereinafter, the number of the floors of the preliminary step pattern structure 103 may be the number of the step patterns formed from the uppermost downward except for the uppermost step pattern. The upper surface exposed by the first preliminary step pattern structure 103 may be the fourth insulating interlayer.

Figure 1C:
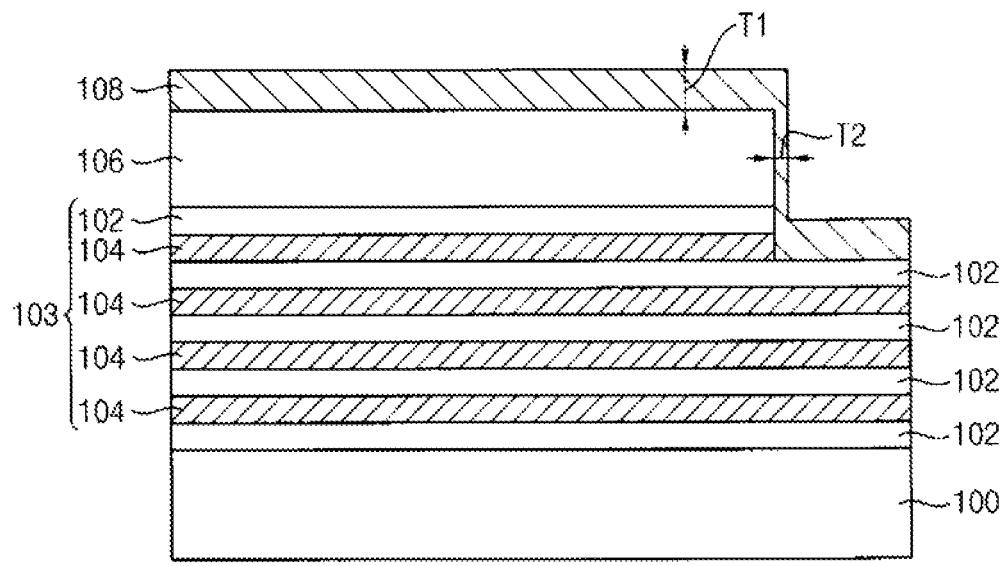

Referring to FIG. 1C, a first passivation layer 108 may be formed on the upper surface and the side wall of the first photoresist pattern 106, on the exposed side wall of the first preliminary step pattern structure 103 and on the fourth insulating interlayer. The thickness of the first passivation layer 108 on the upper surface of the first photoresist pattern 106 and on the surface of the fourth insulating interlayer, which are planar in a horizontal direction, may be a first thickness T1. The thickness of the first passivation layer 108 on the side wall of the first photoresist pattern 106 and on the side wall of the first preliminary step pattern structure 103, which are vertically inclined portions, may be a second thickness T2 less than the first thickness T1. The second thickness T2 may be 50% or less than the first thickness T1.

The first passivation layer 108 may comprise an inorganic material. If the first passivation layer 108 were to comprise an organic material including carbon, the passivation layer formed on the planar portions might not have a thickness greater than that of the passivation layer formed on the vertically inclined portions. In addition, the thickness of the passivation layer formed on the planar portions might not be uniform. As described above, if the first passivation layer is formed by using an organic material, controlling the thickness uniformity may be challenging, and a passivation layer having the above-described thickness properties might not be formed.

The first passivation layer 108 may be formed from a material hardly removable during a trimming process that removes a portion of the first photoresist pattern 106. In addition, the first passivation layer 108 may be formed from a material easily removable during an etching process that patterns the sacrificial layer 104 and the insulating interlayer 105.

The first passivation layer may comprise the same material as the fourth insulating interlayer. In particular, the first passivation layer 108 may comprise silicon oxide. In this case, the remaining first passivation layer 108 may be simultaneously removed while patterning the fourth insulating interlayer.

The process of forming the first passivation layer 108 is not performed in a separate deposition chamber, but may be performed in an etching chamber. The first passivation layer may be formed by injecting a source gas for the first passivation layer 108 into the etching chamber. Since the first passivation layer 108 may be formed in an etching chamber, a source gas should include little or no contamination generating materials. To form the first passivation layer 108, $SiCl_4$ and $O_2$ gas may flow into the etching chamber. A $SiO_x$ layer may be formed as the first passivation layer 108.

Figure 1D:
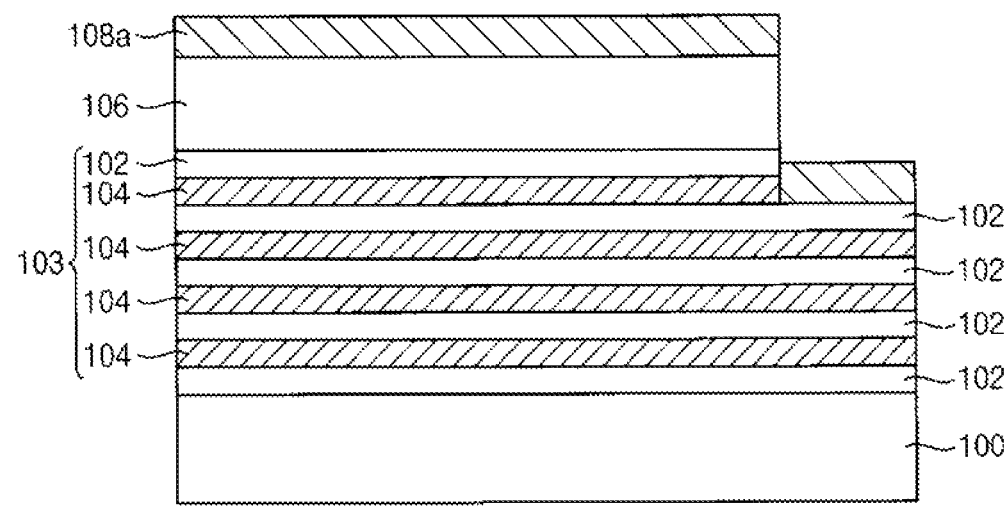

Referring to FIG. 1D, the portion of first passivation layer 108 formed on the side wall of the first photoresist pattern 106 and the side wall of the first preliminary step pattern structure 103 may be selectively etched. Then, the first passivation layer 108 on the upper surface of the first photoresist pattern 106 and on the surface of the fourth insulating interlayer 102, remains to form a first passivation layer pattern 108a. The first passivation layer pattern 108a may cover at least the surface portion of the first photoresist pattern. The selective etching process of the first passivation layer 108 may be performed in the etching chamber used for depositing the first passivation layer 108.

A first portion of the first passivation layer 108 formed on the side wall of the first photoresist pattern 106 and the first preliminary step pattern structure 103 may be thinner than a second portion of the first passivation layer 108 formed on the upper surface of the first photoresist pattern 106 and the fourth insulating interlayer 102. Accordingly, even though the first portion of the first passivation layer 108 formed on the side wall of the first photoresist pattern 106 and first preliminary step pattern structure 103 may be removed, the first portion of the first passivation layer 108 formed on the upper surface of the first photoresist pattern 106 and the fourth insulating interlayer 102 may remain. Therefore, a sufficiently thick first passivation layer pattern 108a may be formed.

Figure 1E:
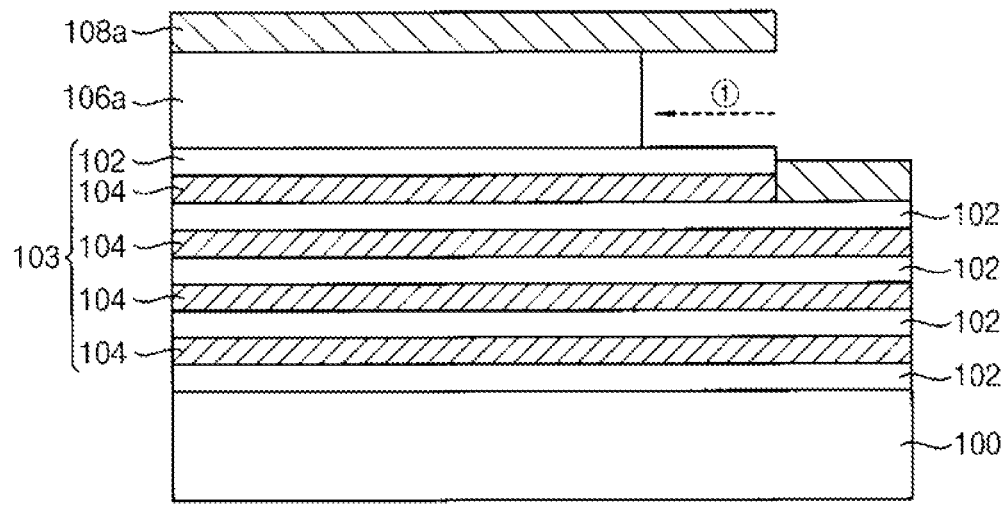

Referring to FIG. 1E, a first trimming process (①) may be performed to remove a portion of the uncovered side wall of the first photoresist pattern 106. The first trimming process may be performed in the same etching chamber used for depositing the first passivation layer 108.

The width of the portion of the first photoresist pattern 106 removed by the first trimming process may be substantially the same as the upper width of the step pattern structure of each floor to be formed. The first trimming process may be performed by a dry etch process using oxygen or ozone as a main etching gas. After completing the first trimming process, a second photoresist pattern 106a having a width less than that of the first photoresist pattern 106 may be formed.

If there is no first passivation layer pattern 108a, a portion of the upper surface of the first photoresist pattern 106 may be removed during the first trimming process, which may decrease the thickness of the second photoresist pattern. In this case, repeated trimming processes may render the thickness of the photoresist pattern to be too small to be used as an etching mask. Accordingly, the number of the trimming processes may be limited. In particular, the number of the trimming processes may be limited to three.

However, the first passivation pattern 108a covering the upper portion of the first photoresist pattern 106 is hardly removed during the trimming processes. Accordingly, the upper portion of the first photoresist pattern 106 is hardly removed during the trimming process. The second photoresist pattern 106a formed after the trimming process may have essentially the same thickness as that of the first photoresist pattern 106.

As described above, the thickness of the photoresist pattern is essentially unchanged by trimming processes that reduce the width of the photoresist pattern. Therefore, the number of the trimming processes for the photoresist pattern may be increased.

Figure 1F:
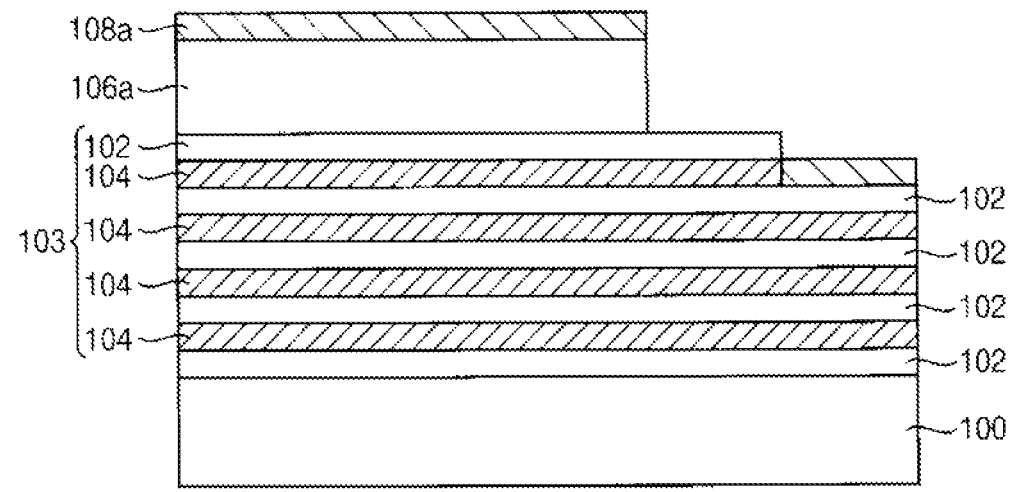

Referring to FIG. 1F, at least a portion of the first passivation layer pattern 108a may be removed. In particular, the portion protruding from the side of the second photoresist pattern 106a may be removed as illustrated in FIG. 1F. Alternatively, the whole of the first passivation layer pattern 108a may be removed. The process of removing at least a portion of the first passivation layer pattern 108a may be performed in the same etching chamber used for depositing the first passivation layer 108.

The fifth and fourth insulating interlayers 102 may be exposed by the side portion of the second photoresist pattern 106a.

Figure 1G:
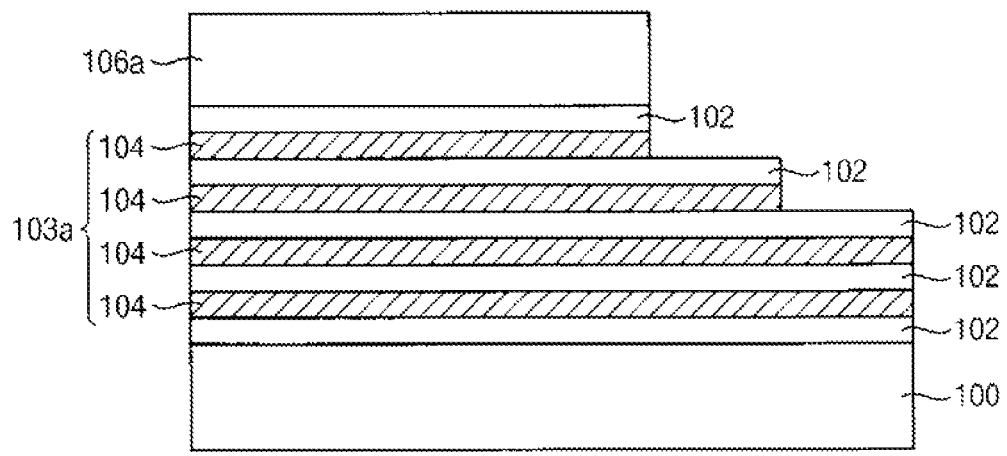

Referring to FIG. 1G, the exposed insulating interlayers 102 and underlying sacrificial layers 104 may be etched, respectively, by using the second photoresist pattern 106a as an etching mask. Two insulating interlayers 102 and two sacrificial layers 104 from the uppermost layer may be etched.

The first passivation layer pattern 108a may be formed by using the same material as the insulating interlayers. In this case, the remaining first passivation layer pattern 108a may be removed while removing the insulating interlayers 102 and the sacrificial layers 104.

After completing the above described process, a second preliminary step pattern structure 103a may be formed. The second preliminary step pattern structure has a two floor step pattern. Through the side portion of the second photoresist pattern 106a, the fourth and the third insulating interlayers 102 may be exposed.

The etching process may be performed in the same etching chamber used for depositing the first passivation layer 108. As described above, the processes explained with reference to FIGS. 1C to 1G may be performed in situ in the same etching chamber.

In succession, the processes explained with reference to FIGS. 1C to 1G may be repeated. The processes explained with reference to FIGS. 1C to 1G comprise one process cycle, and the number of process cycles may be the number of trimming processes. Hereinafter, a process cycle repeated for forming the step pattern structure will be described in brief.

Figure 1H:
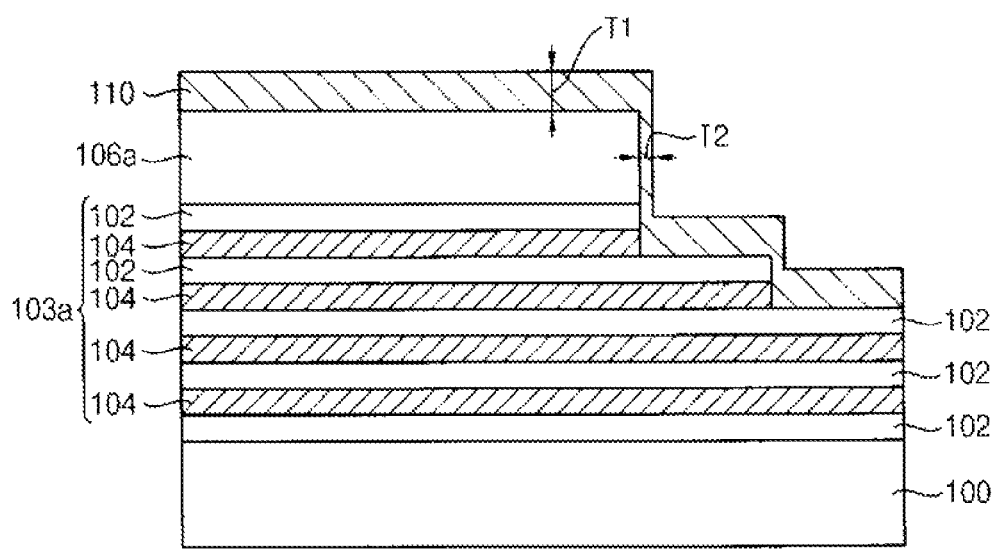

Referring to FIG. 1H, a second passivation layer 110 may be formed on the upper surface and the side wall of the second photoresist pattern 106a, on the side wall of the second preliminary step pattern structure 103a and on the upper surface of the fourth and the third insulating interlayers 102. The thickness of the second passivation layer 110 on the upper surface of the second photoresist pattern 106a and the fourth and the third insulating interlayers, which are planar in a horizontal direction, may be a first thickness T1. The thickness of the second passivation layer 110 on the side wall of the second photoresist pattern 106a and the second preliminary step pattern structure 103a, which are vertically inclined portions, may be a second thickness T2 less than the first thickness T1. The second thickness T2 may be 50% or less than the first thickness T1. The second passivation layer 110 may comprise the same material as the first passivation layer 108.

Figure 1I:
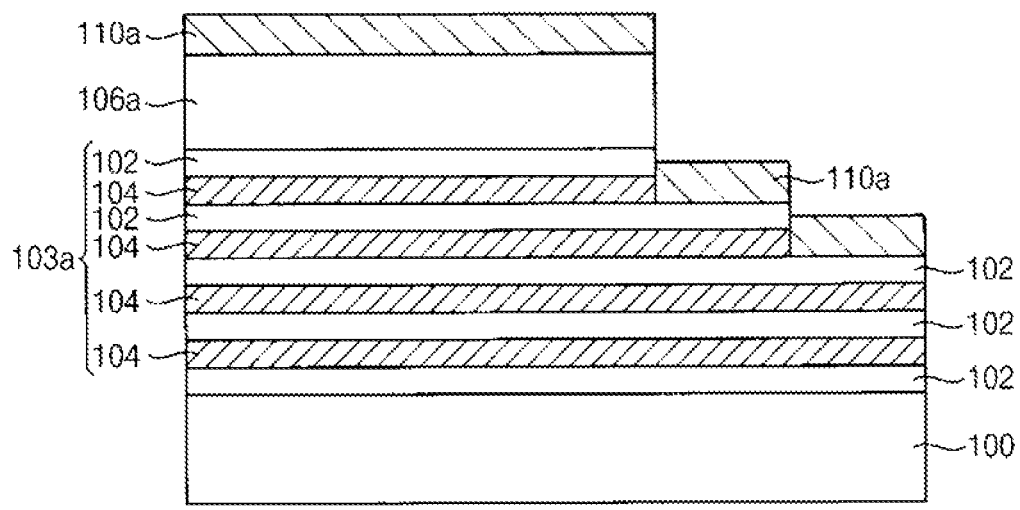

Referring to FIG. 1I, the sidewall portions of the second passivation layer 110 may be selectively etched to form a second passivation layer pattern 110a. As described above, a new passivation layer pattern may be formed before a subsequent trimming process.

Figure 1J:
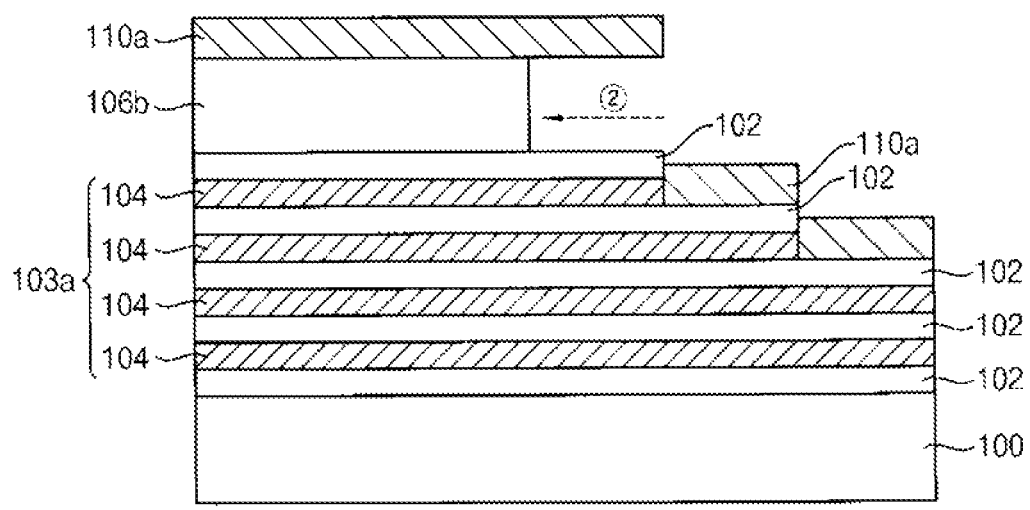

Referring to FIG. 1J, a second trimming process (②) may be performed to remove an uncovered portion of the side wall of the second photoresist pattern 106a to form a third photoresist pattern 106b.

Figure 1K:
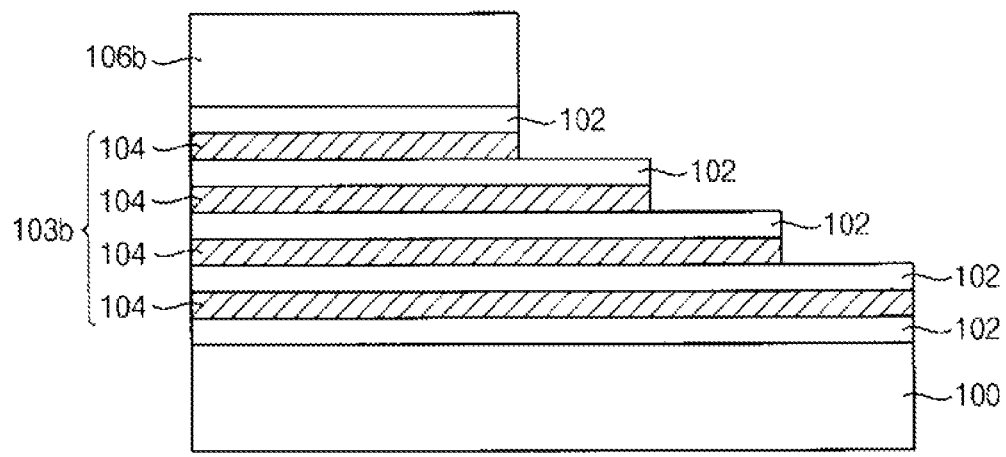

Referring to FIG. 1K, at least a portion of the second passivation layer pattern 110a may be removed. Exposed insulating interlayers 102 and underlying sacrificial layers 104 may be respectively etched using the third photoresist pattern 106b as an etching mask. After completing the process, a third preliminary step pattern structure 103b may be formed. The third preliminary step pattern structure 103b has a three floor step pattern. Through the side of the third photoresist pattern 106b, the second to fourth insulating interlayers 102 may be exposed.

The processes may be the same as the processes explained with reference to FIGS. 1F to 1G.

Figure 1L:
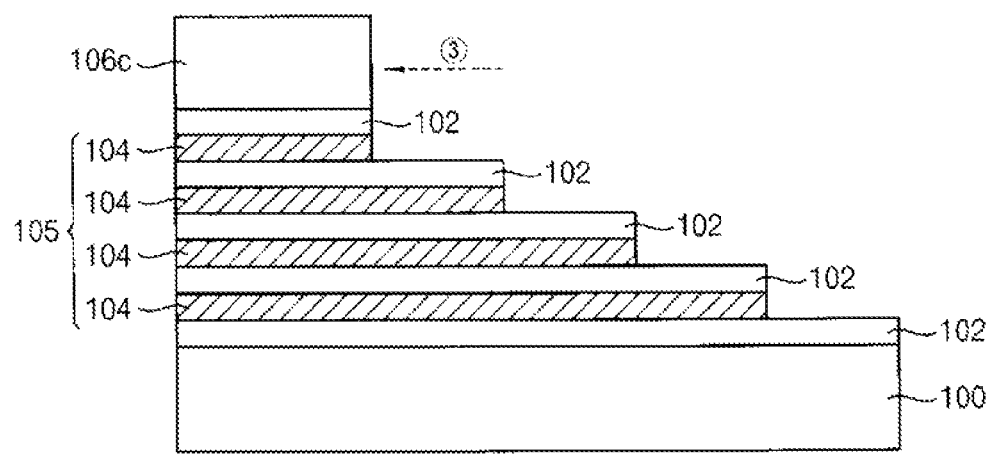

Referring to FIG. 1L, the same one process cycle as explained with reference to FIGS. 1C to 1G may be performed with respect to the structure illustrated in FIG. 1K. Accordingly, one more floor of the step pattern may be formed to complete a four floor step pattern structure 105.

The process cycles may be repeatedly performed as described above to form a step pattern structure having any desired number of floors.

In accordance with exemplary embodiments, the shape and thickness of the photoresist pattern are essentially unchanged during the trimming processes because of the passivation layer pattern. Accordingly, the number of the trimming processes may be increased, and four or more trimming processes may be performed.

Hereinafter, a method of forming a multi-floor step pattern structure by using the above described method of Example 1 will be described.

FIGS. 2A to 2G are cross-sectional views illustrating a method of forming a step pattern structure in accordance with exemplary embodiments.

Referring to FIG. 2A, insulating interlayers 202 and sacrificial layers 204 may be subsequently and alternately stacked on a substrate 200. At the uppermost layer, an insulating interlayer 202 may be formed. The number of the insulating interlayers 202 and the sacrificial layers 204 is not limited. In this exemplary embodiment, first to nineteenth insulating interlayers 202 and first to eighteenth sacrificial layers 204 may be alternately and repeatedly stacked from the surface of the substrate 200. In this exemplary embodiment, the step pattern structure has eighteen step shape patterns at the edge portions.

When the number of the step shape patterns of the step pattern structure is large as in this exemplary embodiment, it may be challenging to form a step pattern structure by performing one photolithography process even though applying the trimming process. Accordingly, forming the step pattern structure will be explained by performing three photolithography processes in this exemplary embodiment. A step pattern structure formed by performing each of the photolithography and etching process may include a first photo region, a second photo region and a third photo region.

First, a first photoresist layer may be formed on the uppermost insulating interlayer 202, and a first photolithography process may be performed on the first photoresist layer to form a first photoresist pattern 206. The first photoresist pattern 206 may be provided as a mask for completing a few step shape patterns in the uppermost part. In this exemplary embodiment, a method of forming six step shape patterns from the upper portion by using the first photoresist pattern 206 will be described. In this case, the upper surfaces of the second and the third photo regions may be exposed by the first photoresist pattern 206.

Figure 2B:
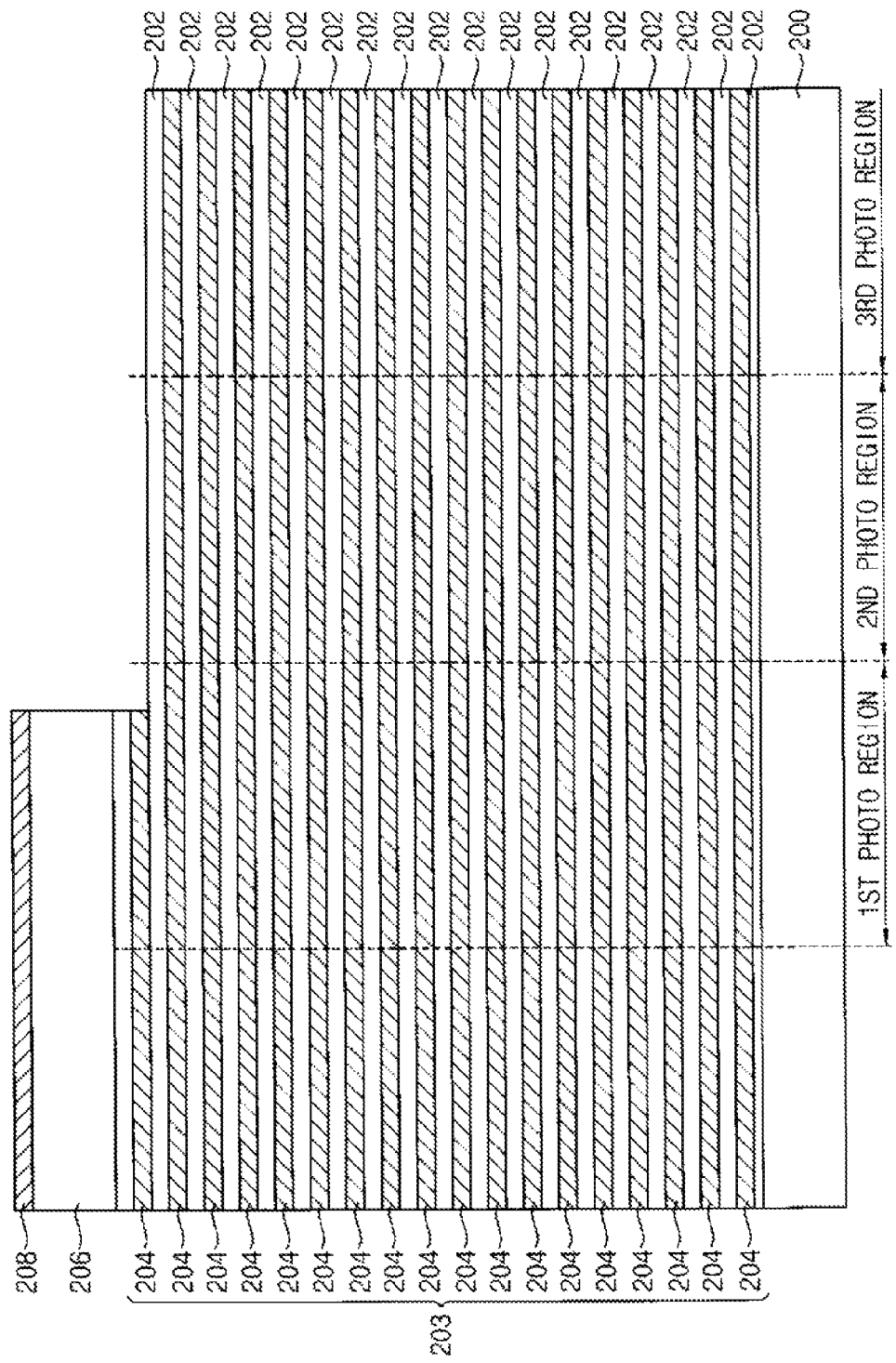

Referring to FIG. 2B, an uppermost insulating interlayer 202 and one sacrificial layer 204 exposed by the first photoresist pattern 206 may be etched using the first photoresist pattern 206. A first preliminary step pattern structure 203 is formed by the etching process. A first passivation layer may be formed on the first photoresist pattern 206 and on the first preliminary step pattern structure 203. A portion of the first passivation layer may be etched to form a first passivation layer pattern 208 exposing the side wall of the first photoresist pattern while covering the upper surface of the first photoresist pattern. The above-described processes may be the same as those processes explained with reference to FIGS. 1B to 1D.

Referring to FIG. 2C, a first trimming process (1) may be performed on the first photoresist pattern to form a second photoresist pattern. Then, at least a portion of the second passivation layer pattern 208 protruding past the side of the second photoresist pattern may be removed. By using the second photoresist pattern as an etching mask, two insulating interlayers 202 and two sacrificial layers 204 from the uppermost layer may be etched. The above-described processes may be performed according to the same processes as explained referring to FIGS. 1E to 1G.

In succession, a number of one process cycles including the processes explained with reference to FIGS. 1C to 1G may be repeated to form a first step pattern structure 209. The first step pattern structure 209 has sixth step shape patterns in the first photo region.

The same number of the trimming processes may be performed with respect to the first photoresist pattern 206 as the number of the process cycles. In addition, a first step pattern structure 209 including one more floor than the number of the trimming processes may be formed in the first photo region.

In this exemplary embodiment, five trimming and etching processes were performed to form the first step pattern structure 209 as illustrated in FIG. 2C. In this case, a six floor first step pattern structure 209 was formed from the upper portion by performing one photolithography process. However, the number of the trimming processes is not limited thereto, but may be increased or decreased. After forming the first step pattern structure 209, the first photoresist pattern may be removed.

As described above, the number of the trimming processes may be increased by forming a passivation layer pattern. Even though a passivation layer pattern may be formed, the first photoresist pattern may be somewhat damaged or removed while removing the passivation layer pattern. Accordingly, the number of trimming processes for the first photoresist pattern may be limited. Thus, after performing a specific number of trimming processes, other photolithography processes may be performed.

Figure 2D:
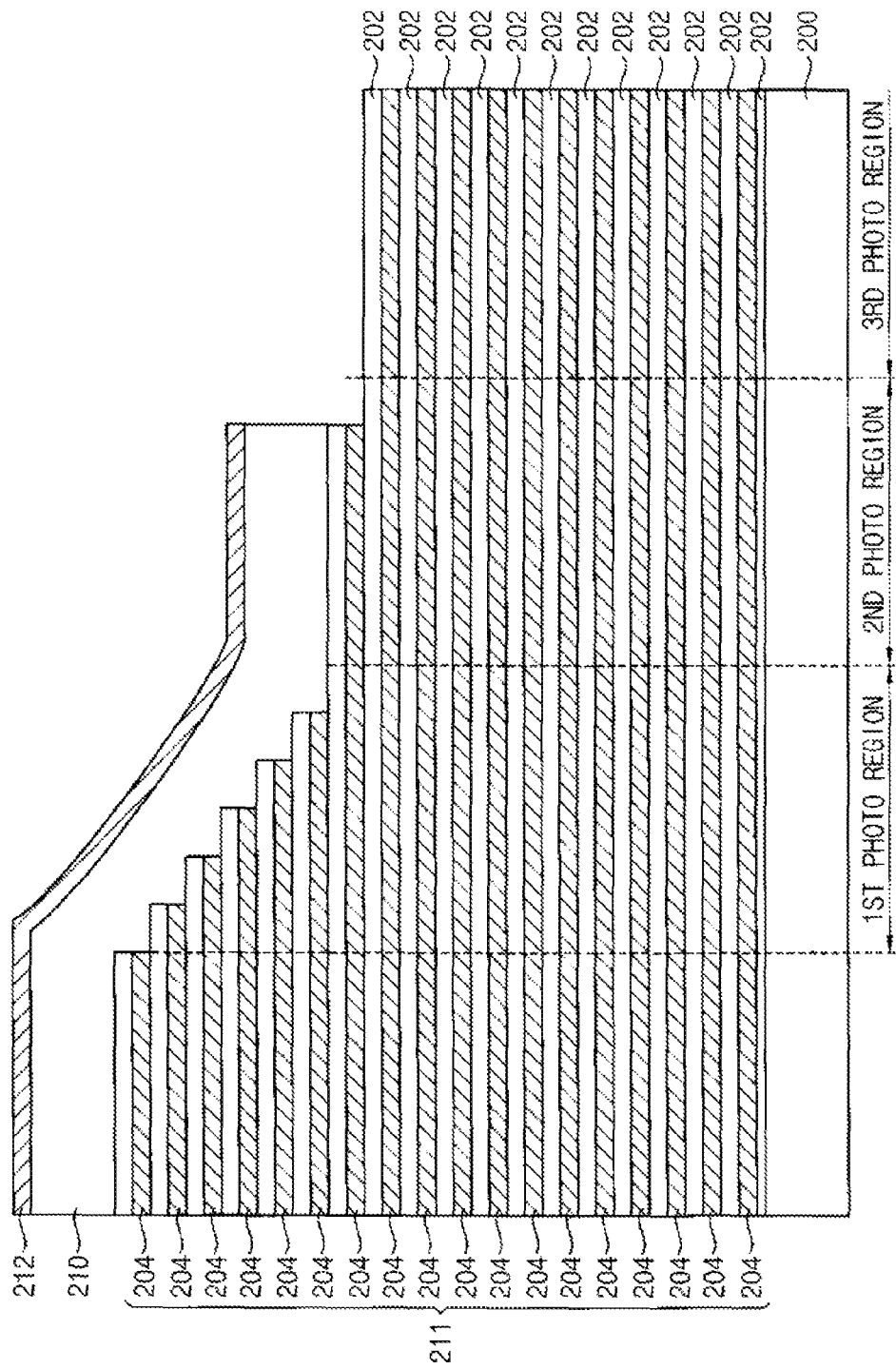

Referring to FIG. 2D, a second photoresist layer may be formed on the first step pattern structure 209. In this case, the thickness of the second photoresist layer formed on the step shape patterns of first step pattern structure 209 may be less than the thickness formed on planar insulating interlayer of the first step pattern structure 209.

A second photolithography process may be performed with respect to the second photoresist layer to form a second photoresist pattern 210.

The second photoresist pattern 210 may be provided as a mask for completing a second step pattern structure that comprises a several floor step shape patterns under the first step pattern structure 209. The second step pattern structure includes the step shape patterns of the first step pattern structure 209. In this exemplary embodiment, a method of forming a six-floor step shape pattern will be explained using the second photoresist pattern 210. Therefore, the second step pattern structure has a 12-floor step shape pattern. A portion of the step shape patterns including the second step pattern structure may be formed in the second photo region by using the second photoresist pattern 210. The second photoresist pattern 210 may cover the first step pattern structure 209 in the first photo region. The second photoresist pattern 210 may expose the whole upper surface of the third photo region.

One exposed uppermost insulating interlayer and one sacrificial layer may be etched using the second photoresist pattern 210 as an etching mask to form a seventh preliminary step pattern 211.

Then, a second passivation layer may be formed on the upper surface and side wall of the second photoresist pattern 210, the side wall of the seventh preliminary step pattern 211 and the upper surface of the exposed insulating interlayer 202. The second passivation layer formed on the side wall of the second photoresist pattern 210 and the seventh preliminary step pattern 211 may be selectively etched to form a second passivation layer pattern 212.

Referring to FIG. 2E, a first trimming process (1) may be performed to remove an uncovered portion of the side wall of the second photoresist pattern 210, to form a second photoresist pattern.

If there were no second passivation layer pattern 212, the upper surface of the second photoresist pattern 210 may also be removed by the trimming process, which may decrease a thickness of the second photoresist pattern. In particular, since the second photoresist pattern 210 formed on the step shape patterns of the first step pattern structure 209 may be relatively thin, this portion of the second photoresist pattern 210 may be removed. In this case, the step shape patterns of the first step pattern structure 209 may not be masked. Accordingly, the number of trimming processes may be limited to three or less.

However, in accordance with this exemplary embodiment, the second passivation layer pattern 212 may be provided on the upper surface of the second photoresist pattern 210. Therefore, the upper surface of the second photoresist pattern 210 may be hardly removed during the trimming process with respect to the second photoresist pattern 210. Thus, the number of the trimming processes may be increased to four or more.

Then, a portion of the second passivation layer pattern 212 protruding toward the side of the second photoresist pattern may be removed. The uppermost two insulating interlayers 202 and two sacrificial layers 204 may be etched using the second photoresist pattern as an etching mask. The above-described processes may be performed using the same processes explained with reference to FIGS. 1E to 1G.

In succession, one cycle process including the processes explained with reference to FIGS. 1C to 1G may be repeatedly performed. Through the above-described processes, the second step pattern structure 213 may be formed in the first and second photo region, including a six-floor step shape pattern in the second photo region.

In this exemplary embodiment, five trimming processes and the etching processes may be performed to form the second step pattern structure 213 as illustrated in FIG. 2E. In this case, a six-floor step shape pattern may be formed by performing one photolithography process. After forming the second step pattern structure 213, the second photoresist pattern may be removed.

Referring to FIG. 2F, a third photoresist layer may be formed on the structure including the second step pattern structure. A third photoresist pattern 214 may be formed by performing a third photolithography process on the third photoresist layer.

The third photoresist pattern 214 may be provided as a mask for completing a third step pattern structure comprising a several-floor step shape pattern under the second step shape pattern 109. The third step pattern structure includes the step shape patterns of second step pattern structure 213. A portion of the step shape patterns including third step pattern structure may be formed in the third photo region by using the third photoresist pattern 214. The third photoresist pattern 214 may cover the second step pattern structure 213 of first and second photo region.

Then, one uppermost exposed insulating interlayer and one sacrificial layer may be etched using the third photoresist pattern 214 as an etching mask to form a thirteenth preliminary step pattern 215.

A third passivation layer may be formed on the upper surface and the side wall of the third photoresist pattern 214, on the side wall of the thirteenth preliminary step pattern 215 and on the upper surface of the exposed insulating interlayer 202. The third passivation layer formed on the side wall of the third photoresist pattern 214 and the thirteenth preliminary step pattern 215 may be selectively etched to form a third passivation layer pattern 216.

Referring to FIG. 2G a first trimming process (1) may be performed to remove an uncovered portion of the side wall of the third photoresist pattern 214 to form a second photoresist pattern.

Then, a portion from the third passivation layer pattern 216 that protrudes toward the side of the second photoresist pattern may be removed. Two insulating interlayers 202 and the sacrificial layers 204 from the uppermost layer may be etched using the second photoresist pattern as an etching mask. The above-described processes may be the same as the processes explained with reference to FIGS. 1E to 1G.

In succession, one process cycle including the processes explained with reference to FIGS. 1C to 1G may be repeatedly performed. Through the above processes, a third step pattern structure 217 may be formed in the first to third regions.

As described above, since the number of trimming processes may be increased after performing one photolithography process in accordance with this exemplary embodiment, the number of photolithography processes performed to form a many-floor step pattern structure may be decreased. Accordingly, a many floor step pattern structure may be easily formed through a simplified process.

Method of Confirming Number of Trimmings

From the completed step pattern structure, the number of photolithography processes and the number of trimming processes performed to form the step pattern structure may be confirmed. Hereinafter, a method of confirming the number of the photolithography processes and the number of the trimming processes used to form the step pattern structure will be briefly described.

The number of different, required reticles may be the same as the number of the photolithography processes performed to form the step pattern structure. In particular, five reticles may be required when five photolithography processes are performed to form the step pattern structure.

In addition, a photo alignment process may be performed whenever the photolithography process is performed. While performing the photo alignment process, an alignment key, including a vernier scale and a main scale, may be generated. Accordingly, the number of the photolithography processes may be found by confirming the number of the alignment keys.

Figure 3A:
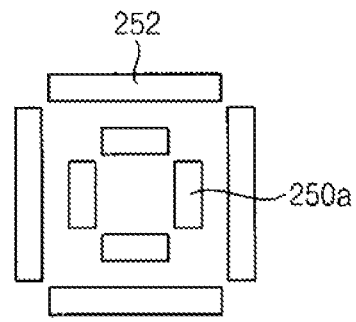
FIGS. 3A to 3C are plan views illustrating photo align keys respectively obtained while performing a photolithography process.
Figure 3B:
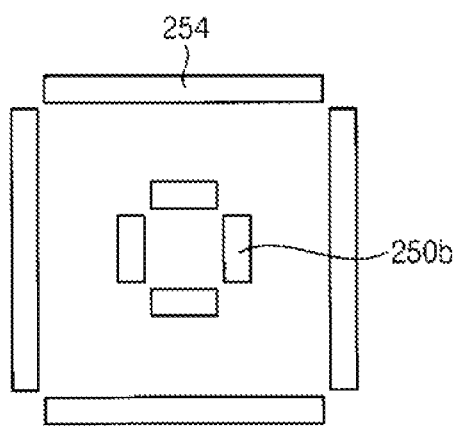
Figure 3C:
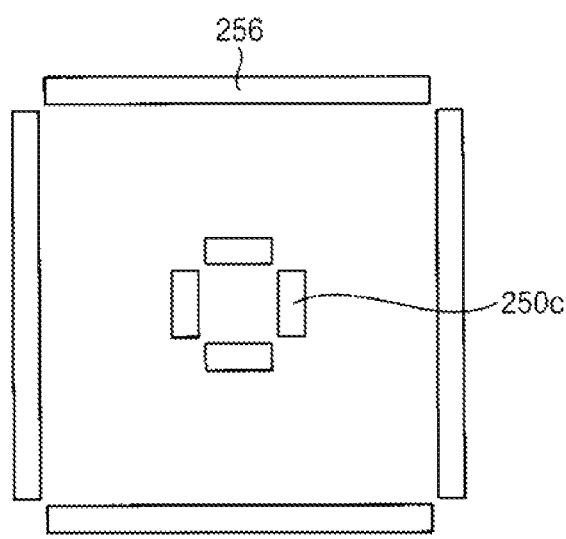

FIGS. 3A to 3C are plan views illustrating photo alignment keys, respectively obtained while performing a photolithography process.

Referring to FIG. 3A, a first photo alignment key, including a main scale 250a and a vernier scale 252, may be generated for aligning a first photolithography process. In this case, main scales (250b in FIGS. 3B and 250c in FIG. 3C) of photo alignment keys to be used in subsequent photolithography processes may be formed together while performing the first photolithography process. The main scales to be used in the subsequent photolithography processes may be formed at different positions from those of the first photo alignment key.

Referring to FIG. 3B, a second photo alignment key, including a main scale 250b and a vernier scale 254, may be formed for aligning a second photolithography process. Referring to FIG. 3C, a third photo alignment key, including a main scale 250c and a vernier scale 256, may be formed for aligning a third photolithography process.

As described above, three photo alignment keys having different shapes may be formed when performing three photolithography processes as illustrated in FIGS. 3A to 3C. Accordingly, through confirming the photo alignment keys, the number of the photolithography processes may be found.

The number of floors formed by performing one photolithography process may be found by dividing the total number of the floors of the step pattern structure by the number of the photolithography processes. In particular, when four photolithography processes were performed to form a 24-floor step pattern structure, a 6-floor step shape pattern was found to be formed by performing one photolithography process. In this case, one floor of the step shape pattern may be formed by the first photoresist pattern formed while performing one photolithography process, and the remaining five floors of the step shape patterns may be formed by second to sixth photoresist patterns formed by successive trimmings of the first photoresist pattern. Thus, to obtain the above-described step shape patterns, five trimming processes are performed for each photolithography process.

As described above, the number of trimming processes may be confirmed from the completed step pattern structure. Thus, whether four or more trimming processes have been performed with respect to a photoresist pattern may be confirmed as in this exemplary embodiment.

A method of forming a step pattern structure as described above may be used for manufacturing a vertical-type semiconductor device. In particular, a method of forming a step pattern structure may be applied to manufacture a vertical-type semiconductor device having a word line structure including a metal. In this case, a step of removing a sacrificial layer pattern included in the step pattern structure and of filling a metal material into the removed space of the sacrificial layer pattern may be additionally performed. The filled metal material may be provided as a word line in each floor.

Alternatively, a method of forming a step pattern structure may be applied to manufacture a vertical-type semiconductor device having a word line structure including polysilicon. In this case, the sacrificial layer pattern in the step pattern structure may comprise the polysilicon. Accordingly, a step pattern structure may be provided as a stacked structure of insulating interlayers and word line structures of the vertical-type semiconductor device.

Hereinafter, a method of manufacturing a vertical-type semiconductor device having a word line structure including a metal by using a method of forming a step pattern structure will be briefly described.

EXAMPLE 2

FIGS. 4A to 4D are cross-sectional views illustrating a method of forming a vertical-type semiconductor device in accordance with Example 2 of the present inventive concept.

Referring to FIG. 4A, there is provided a semiconductor substrate 200 including a cell region for forming memory cells. The cell region may include a cell forming region for forming the memory cells and a connection region for forming wirings for electrically connecting the memory cells. The semiconductor substrate 200 may be a single crystalline silicon substrate.

On the semiconductor substrate 200, first insulating interlayers and sacrificial layers may be subsequently and alternately stacked. The first insulating interlayers may be formed by depositing silicon oxide. The sacrificial layers may be formed by using a material having a different etch selectivity with respect to the first insulating interlayers. In particular, the sacrificial layers may be formed by using silicon nitride.

Next, a step shape mold pattern 228 may be formed in the connection region by performing the processes explained with reference to FIGS. 2A to 2G.

Figure 4B:
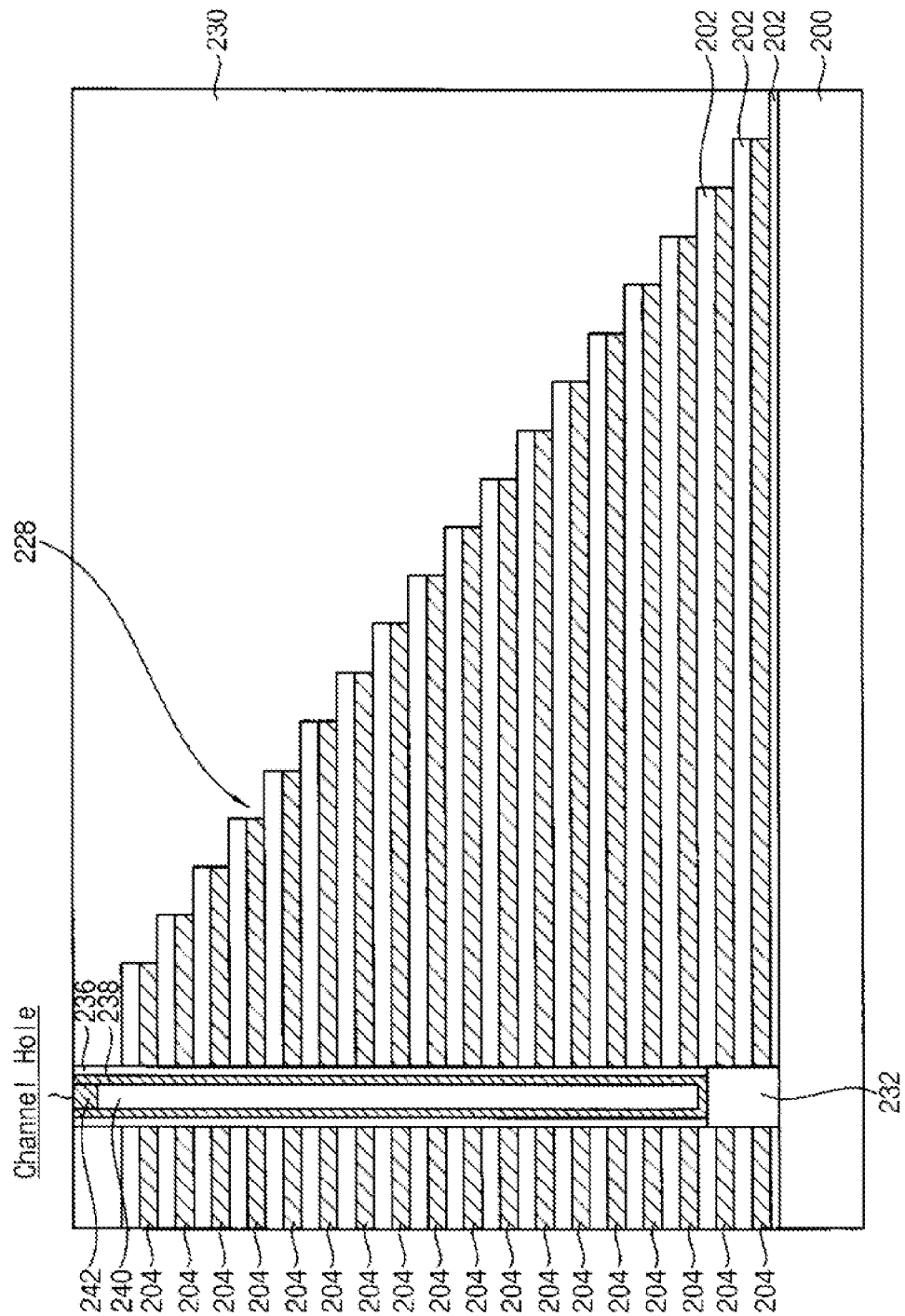

Referring to FIG. 4B, a second insulating interlayer 230 covering the step shape mold pattern 228 may be formed. A plurality of channel holes that penetrate the step shape mold pattern 228 and expose the surface of the substrate 200 may be formed. A semiconductor pattern 232 filling the inner and lower portion of the channel hole may be formed. The semiconductor pattern 232 may be formed through an epitaxial growth process.

On an inner side wall of the channel holes, a charge storing layer and a tunnel insulating layer 236 may be subsequently formed. In FIG. 4B, the charge storing layer and the tunnel insulating layer are illustrated as one layer 236. On the tunnel insulating layer 236, a channel pattern 238 that contacts the semiconductor pattern 232 may be formed. On the channel pattern 238, a burying insulating layer pattern 240 that buries most of the inner portion of the channel holes may be formed. On the burying insulating layer pattern 240, a pad pattern 242 that contacts the side wall of the channel pattern 238 and covers an inlet portion of the channel hole may be formed.

Through the above-described processes, pillar structures that include the semiconductor pattern 232 and the channel pattern 238 may be formed in the channel hole.

Referring to FIG. 4C, an opening portion (not illustrated) having a trench shape that extends in one direction may be formed by etching the step shape mold pattern between the pillar structures. Through the bottom of the opening portion, the surface of the substrate 200 may be exposed. The opening portion may extend in a same direction as a word line structure.

After forming the opening portion, the sacrificial layer patterns 204 exposed through the side wall of the opening portion may be removed to form gaps between the stacked first insulating interlayers 202.

Along the inner surface of the gap and the opening portion, a blocking dielectric layer, a barrier metal layer and a metal layer may be formed. Then, the barrier metal layer and the metal layer formed in the opening portion may be etched to form word line structures 244.

The word line structures 244 may be formed in the space formed by removing the sacrificial layer patterns 204. Accordingly, the side edge portions of the word line structures 244 may have a step shape. The side edge portion of the word line structure at each floor may be a word line pad region for connection with a contact.

In addition, N-type impurities may be doped into the substrate 200 through the bottom of the opening portion to form an impurity region (not illustrated) to be used as a source line (S/L).

Then, a third insulating interlayer 246 that covers the structures may be formed.

A bit line contact that contacts a pad pattern and a bit line that electrically connects with the bit line contact may be formed in the third insulating interlayer 246.

Referring to FIG. 4D, contact plugs 248 that contact with the pad region of the word line structure may be formed through the third and second insulating interlayers 246 and 230, and the first insulating interlayer 202 at each floor.

As described above, the number of trimming processes with respect to the photoresist pattern may be increased to at least four while forming the step shape mold pattern provided as pad regions for the word line structures. Thus, the number of the photolithography processes performed for forming the step shape mold pattern may be decreased. A highly integrated vertical-type semiconductor device that includes a large number of vertically stacked word line structures may be easily manufactured.

Hereinafter, a method of manufacturing a vertical-type semiconductor device having word line structures that include polysilicon by using the method of forming a step shape pattern will be briefly described.

EXAMPLE 3

Figure 5A:
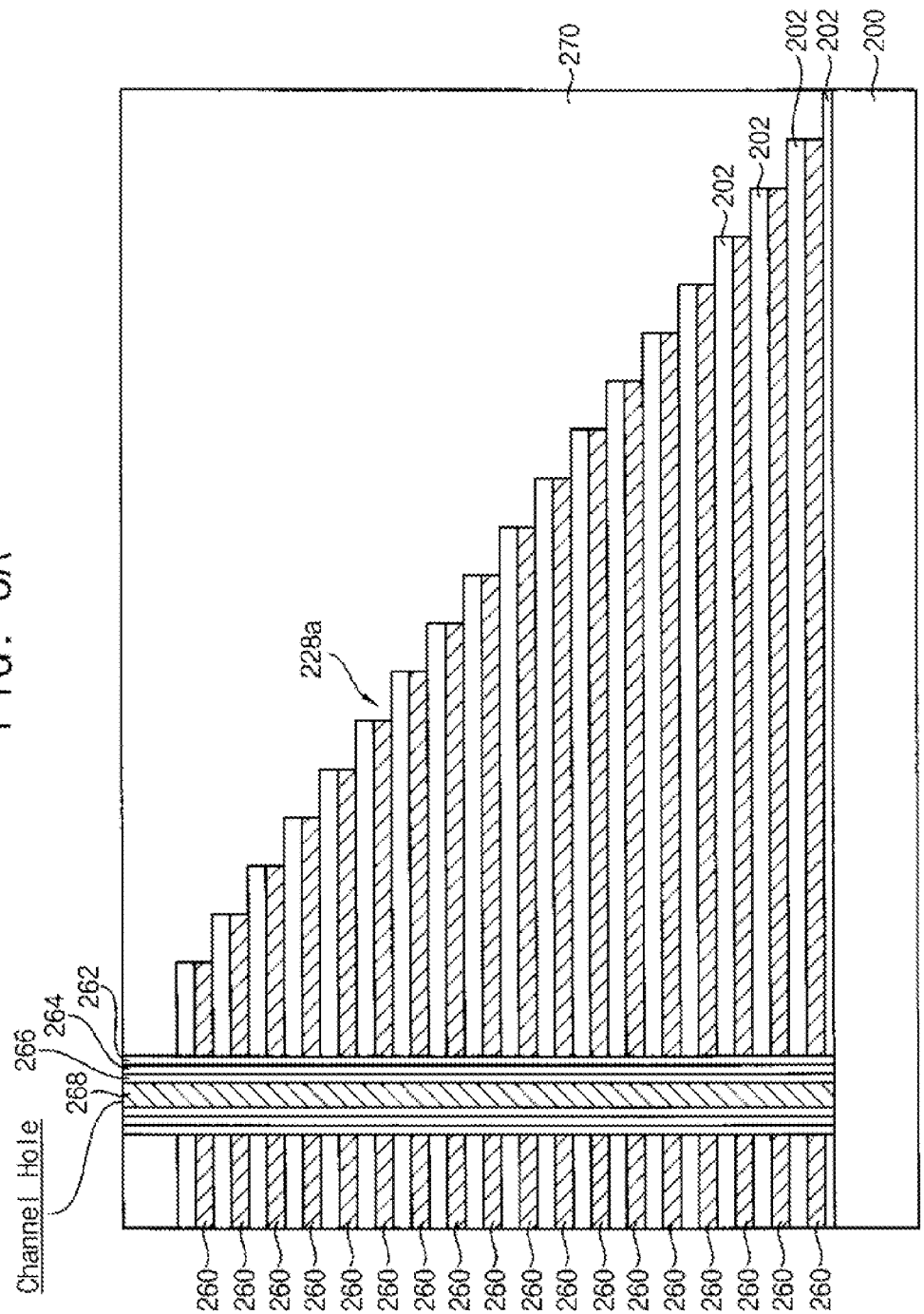
FIGS. 5A and 5B are cross-sectional views illustrating a method of forming a vertical-type semiconductor device in accordance with Example 3 of the present inventive concept.
Figure 5B:
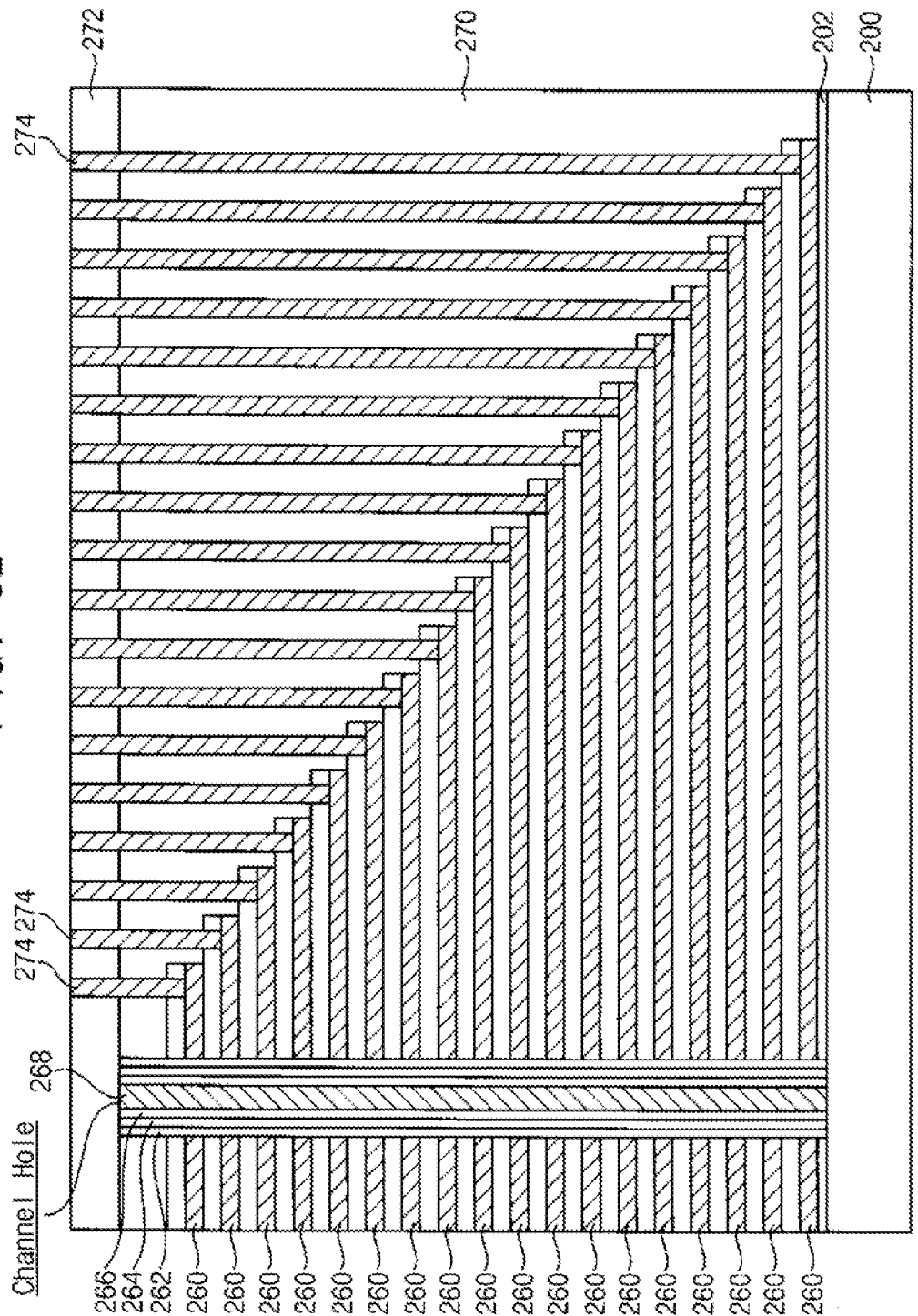

FIGS. 5A and 5B are cross-sectional views illustrating a method of forming a vertical-type semiconductor device in accordance with Example 3 of the present inventive concept.

Referring to FIG. 5A, there is provided a semiconductor substrate 200 that includes a cell region for forming memory cells. The cell region may include a cell forming region for forming the memory cells and a connection region for forming wirings for electrically connecting the memory cells. The semiconductor substrate 200 may be a single crystalline silicon substrate.

On the semiconductor substrate 200, first insulating interlayers 202 and polysilicon layers 260 may be subsequently and alternately stacked. In this exemplary embodiment, polysilicon layers 260 may be formed instead of the sacrificial layers. The first insulating interlayers 202 may be formed by depositing silicon oxide. The polysilicon layers may be provided as word line structures through subsequent processes.

Next, a step shape mold pattern 228a may be formed in the connection region by performing processes explained with reference to FIGS. 2A to 2G.

Then, a second insulating interlayer 270 that covers the step shape mold pattern 228a may be formed. A plurality of channel holes that penetrate the step shape mold pattern 228a and expose the surface of the substrate may be formed.

On an inner side wall of the channel holes, a blocking dielectric layer 262, a charge storing layer 264 and a tunnel insulating layer 266 may be subsequently formed. On the tunnel insulating layer 266, a channel pattern 268 that contacts the surface of the substrate 200 may be formed. The channel pattern 268 may completely fill up the inner portion of the channel hole as illustrated in FIG. 5A.

By performing the above-described processes, the tunnel insulating layer 266, the charge storing layer 264 and the blocking dielectric layer 262 may be stacked on the side portion of the channel pattern 268. Thus, cell transistors may be completed for each floor.

Referring to FIG. 5B, a third insulating interlayer 272 may be formed on the second insulating interlayer 270. Although not illustrated, a bit line contact that contacts the channel pattern 268 and a bit line that electrically connects with the bit line contact may be formed in the third insulating interlayer 272.

Then, contact plugs 274 that contact the pad region of the word line structure may be formed through the third and second insulating interlayers 272 and 270, and the first insulating interlayer 202 at each floor.

As described above, the number of trimming processes with respect to the photoresist pattern may be increased to at least four while forming the step shape polysilicon pattern provided as pad regions for the word line structures. Thus, the number of the photolithography processes performed to form the polysilicon patterns may be decreased. A highly integrated vertical-type semiconductor device that includes a large number of vertically stacked word line structures may be easily manufactured.

As described above, a vertical-type memory device in accordance with exemplary embodiments may be manufactured at a reduced cost.

What is claimed is:

1. A method of forming a multi-floor step pattern structure, comprising:
   i) forming a stacked structure by alternately stacking a plurality of insulating interlayers and a plurality of sacrificial layers on a substrate;
   ii) forming a first photoresist pattern on the stacked structure;
   iii) forming a first preliminary step pattern structure by etching portions of one uppermost insulating interlayer and one uppermost sacrificial layer using the first photoresist pattern as an etching mask;
   iv) forming a first passivation layer on an upper surface and a side wall of the first photoresist pattern, and on an upper surface of and a side wall of the first preliminary step pattern structure;
   v) forming a first passivation layer pattern by removing a portion of the first passivation layer formed on the side wall of the first photoresist pattern;
   vi) forming a second photoresist pattern by removing a side wall portion of the first photoresist pattern exposed by the first passivation layer pattern;
   vii) forming a second preliminary step pattern structure by etching two exposed insulating interlayers and two underlying sacrificial layers, using the second photoresist pattern as an etching mask; and
   viii) repeating steps iv) to vii) at least once with respect to the second preliminary step pattern structure to form the multi-floor step pattern structure.

2. The method of claim 1, wherein a first portion of the first passivation layer formed on the upper surface of the first photoresist pattern and on the upper surface of the first preliminary step pattern structure has a thickness greater than that of a second portion of the first passivation layer formed on the side wall of the first photoresist pattern and on the side wall of the first preliminary step pattern structure.

3. The method of claim 1, wherein the first passivation layer includes an inorganic material that is a same material as the uppermost layer of the stacked structure.

4. The method of claim 1, wherein the first passivation layer comprises silicon oxide and is formed by using $SiCl_4$ and an $O_2$ gas as reaction gases.

5. The method of claim 1, wherein the first passivation layer is formed by injecting a source gas into in a chamber for performing the etching that forms the first preliminary step pattern structure.

6. The method of claim 1, wherein processes from step iii) to step vii) are performed in situ in one etching chamber.

7. The method of claim 1, wherein a remaining portion of the first passivation layer pattern on the second photoresist pattern and the first preliminary step pattern structure are removed while forming the second preliminary step pattern structure.

8. The method of claim 1, wherein processes from step iv) to step vii) are repeated four or more times.

9. The method of claim 1, wherein the insulating interlayer is formed from silicon oxide, and the sacrificial layer is formed from a material having an etch selectivity with respect to the insulating interlayer.

10. The method of claim 9, wherein the sacrificial layers comprises silicon nitride or polysilicon.

11. The method of claim 1, further comprising after forming the second photoresist pattern,
   removing a portion of the first passivation layer pattern protruding from a side of the second photoresist pattern.

12. A method of forming a multi-floor step pattern structure, comprising:
   i) forming a stacked structure by alternately stacking a plurality of insulating interlayers and a plurality of sacrificial layers on a substrate;
   ii) forming a photoresist pattern on at least a portion of the stacked structure;
   iii) forming a first preliminary step pattern structure by etching portions of one uppermost insulating interlayer and one uppermost sacrificial layer using the photoresist pattern as an etching mask;
   iv) forming a passivation layer pattern on an upper surface of the photoresist pattern and on an upper surface of the first preliminary step pattern structure;
   v) forming a trimmed photoresist pattern by removing a portion of the side wall of the photoresist pattern exposed by the passivation layer pattern;
   vi) forming a second preliminary step pattern structure by respectively etching two exposed uppermost insulating interlayers and two underlying sacrificial layers using the trimmed photoresist pattern as an etching mask;
   vii) repeatedly performing steps iv) to vi) with respect to the second preliminary step pattern structure n−2 times to form a plurality of steps in the stacked structure;
   viii) repeatedly performing steps ii) to vii) to form a multi-floor step pattern structure.

13. The method of claim 12, wherein processes from step iii) to step vii) are performed in situ in one etching chamber.

14. The method of claim 12, wherein the processes from steps ii) to vii) are repeated at least twice.

15. The method of claim 12, after forming the step pattern structure, further comprising:
   removing the sacrificial layers of each floor; and
   forming a metal material layer in spaces formed by removing the sacrificial layers.

* * * * *